US012745603B2

(12) United States Patent
Chang

(10) Patent No.: US 12,745,603 B2
(45) Date of Patent: Sep. 22, 2026

(54) PICK-AND-PLACE TOOL WITH WARPAGE-CORRECTION MECHANISM

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 441 days.

(21) Appl. No.: 18/171,315

(22) Filed: Feb. 17, 2023

(65) Prior Publication Data

US 2024/0087943 A1 Mar. 14, 2024

Related U.S. Application Data

(60) Provisional application No. 63/375,539, filed on Sep. 13, 2022.

(51) Int. Cl.

| | |
|---|---|
| ***B25J 15/06*** | (2006.01) |
| ***H10P 52/00*** | (2026.01) |
| ***H10P 72/00*** | (2026.01) |
| ***H10P 72/78*** | (2026.01) |

(52) U.S. Cl.

CPC .............. *H10P 72/78* (2026.01); *H10P 52/00* (2026.01); *H10P 72/0428* (2026.01); *H10P 72/0438* (2026.01); *H10P 72/0604* (2026.01); *H10P 72/0606* (2026.01); *B25J 15/0666* (2013.01)

(58) Field of Classification Search

CPC ......................... H01L 21/6838; H01L 21/683; B25J 15/0616; B25J 15/065; B25J 15/0666; B25B 11/005; B23Q 3/088

USPC ....................................... 269/21, 289 R, 903

See application file for complete search history.

(56) References Cited

U.S. PATENT DOCUMENTS

2021/0129175 A1* 5/2021 Bang ................. H01L 21/67103
2022/0139755 A1* 5/2022 Takada ............. H01L 21/68778
414/752.1

* cited by examiner

*Primary Examiner* — Christopher J. Besler
(74) *Attorney, Agent, or Firm* — Kilpatrick Townsend & Stockton LLP

(57) ABSTRACT

A suction head of a pick-and-place tool for semiconductor device packaging is provided. The suction head includes: a suction unit configured to apply a suction force on a top die and pick the top die; and a warpage-correction mechanism. The warpage-correction mechanism includes a pushing mechanism, and the pushing mechanism includes a plurality of pushing units, each of the plurality of pushing units disposed in a corner region of the suction head. Each of the plurality of pushing units includes: a tubular chamber extending vertically relative to a bottom surface of the suction head; and a pusher disposed in the tubular chamber and in air-tight contact with a side wall of the tubular chamber. The pusher is movable vertically and capable of protruding out of the bottom surface of the suction head to push a corner region of the top die and apply a downward force thereon.

15 Claims, 16 Drawing Sheets

Pick and hold a top die, using a suction head of a pick-and-place tool, and control the top die to move downwardly toward a bottom die
352

Cause the top die to contact the bottom die
354

Actuate a pushing mechanism of the suction head to cause a pusher to press down and apply a downward force to a corner region of the top die
356

Press the suction head to bond the top die to the bottom die
358

FIG. 3

120
Vacuum Device
132
Gas
Compressor
242
Gas
Compressor
242
204
204
190a'
190a'
202'
202'
210'
210'
106
180
156
Z
Y
X 120
190a'
180 (Bottom View)
186
186
184
204
204
204
204
204
204
204
204
184
188
184
184
186
186
210' (hollowed pusher)
Y
Z
X 180 (Bottom View)
120
186
184
D1
204
D2
186
204
204
188
184
184
204
204
204
186
186
204
204
184
210 (pusher)

Y
Z
X
180 (Bottom View)
120
186
184
D1'
186
D2'
204
204
204
204
184
188
184
204
204
204
204
186
184
186
210 (pusher)

Y
Z
X

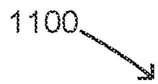
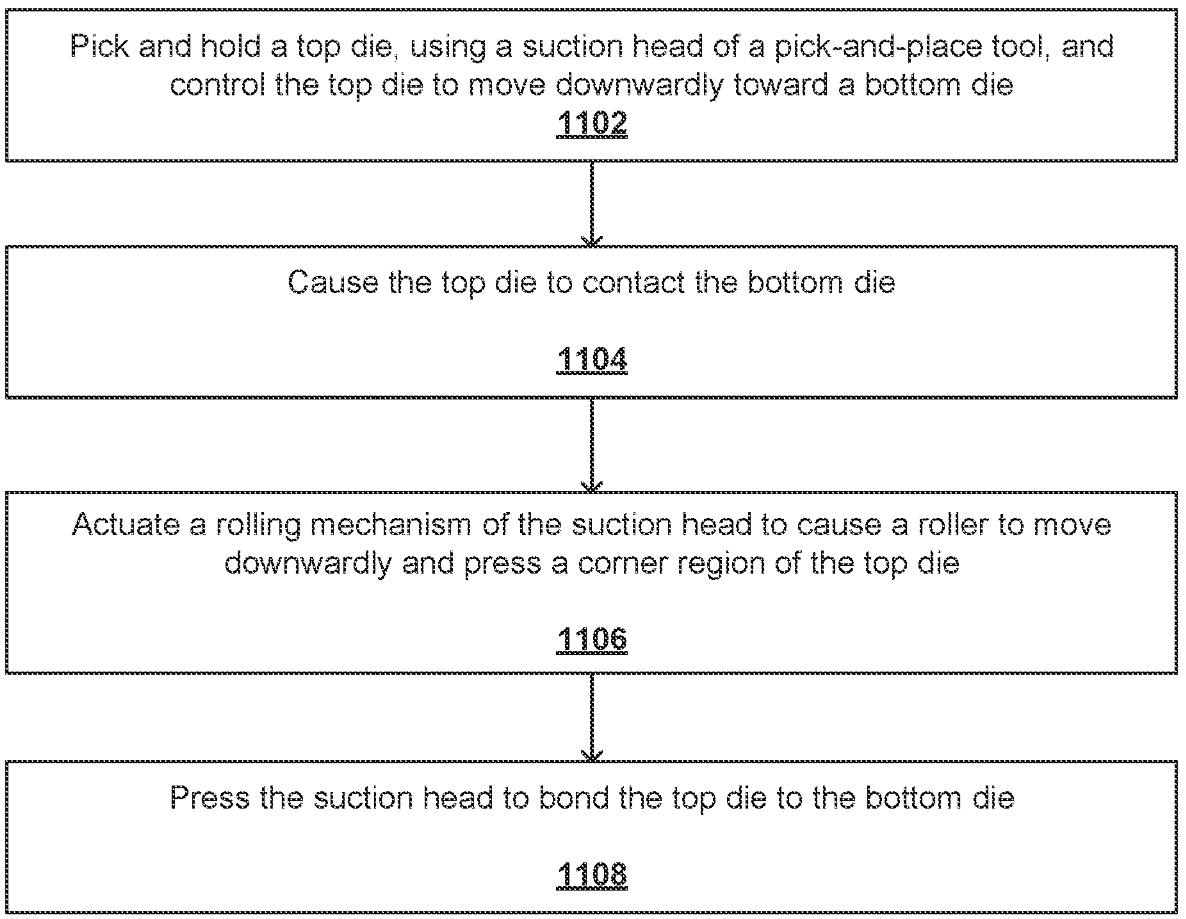
FIG. 11

120
190b
302
304
332
180
106
104
102
156
194
F1
Downward direction
Z
Y
X

PICK-AND-PLACE TOOL WITH WARPAGE-CORRECTION MECHANISM

CROSS-REFERENCE TO RELATED APPLICATIONS

The application claims priority to U.S. Provisional Patent Application 63/375,539 filed Sep. 13, 2022, entitled "Pick-and-Place Tool with Warpage-Correction Mechanism," the entire disclosure of which is incorporated herein by reference.

FIELD

Embodiments of the present disclosure relate generally to semiconductor packaging, and more particularly to improvements to pick-and-place tools.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various dielectric, semiconductor, and metal layers. The areas of the layer that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors.

There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flowchart diagram illustrating an example method in accordance with some embodiments.

FIG. 11 is a flowchart diagram illustrating an example method in accordance with some embodiments.

DETAILED DESCRIPTION OF THE INVENTION

Figure 1:
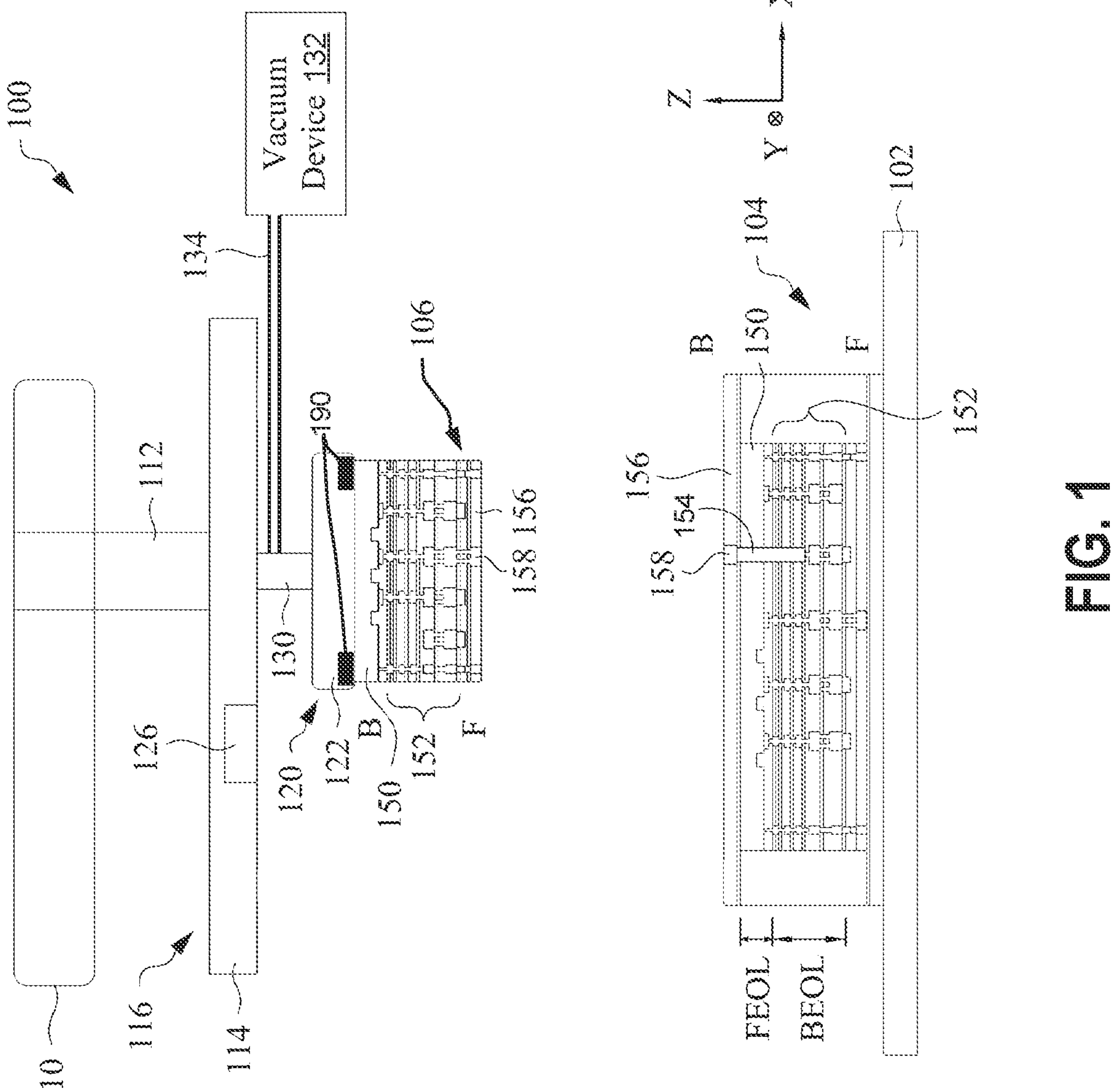
FIG. 1 is a schematic diagram illustrating a cross-sectional view of an example pick-and-place tool in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Packaging technologies were once considered just back-end processes. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

Integrated Fan-Out (InFO) is another wafer-level packaging technology. InFO is a packaging technology that incorporates high-density redistribution layers (RDLs) and through InFO via (TIVs) for high-density interconnect and performance for various applications, such as mobile devices, high performance computing, etc. A wafer is typically diced into individual known good dies (KGDs) after testing, and the KGDs are placed on a temporary carrier with a certain distance apart. RDLs are formed subsequently to enable higher number of external contacts without increasing the size of KGDs.

On the other hand, those multiple chips that are bonded to the interposer in a CoWoS structure or embedded in an InFO structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding.

Stacking dies featuring ultra-high-density-vertical stacking (often using hybrid bonding) is sometimes referred to as System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

For die-to-wafer bonding and die-to-die bonding, which involve stacking a die on a wafer, a die on an interposer, or a die on a die, the infrastructure to handle dies without particle adders, as well as the ability to bond dies, becomes a major challenge. Typically, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility.

Pick-and-place tools (sometimes also referred to as "pick-and-place systems") are part of the infrastructure to handle dies in the context of die-to-wafer bonding and die-to-die bonding. A pick-and-place system is an automatic system that can pick a die (often referred to as a "top die") and place it onto another die (often referred to as a "bottom die") or a host wafer, often in a high-speed manner. A person may take the complexity and difficulty of such tasks of picking and placing a top die for granted. On the contrary, accurate alignment of dies, without comprising the high system throughput, is very challenging, especially considering that the alignment accuracies are on the order of microns (i.e., micrometers). If the position shift error cannot be further reduced, the critical size of hybrid bonding metal pads cannot be reduced, which in turn limits bonding density.

The semiconductor wafer and a die made therefrom has an intrinsic tendency to warp, to a degree that depends upon its thickness and upon the electronic structures that are formed within and upon the substrate. Additionally, because the various layers on and in the wafer include materials having different thermal expansion characteristics, the tendency to warp may vary according to variations in temperature during processing.

It is not uncommon that the top die used in a die-to-die or die-to-wafer bonding process has a warpage. As an example, when the top die is picked up and held by a pick-and-place tool, the corner portions of the top die are elevated relative to the central portion of the top die. Consequently, the corner portions of the top die are not in direct contact with the bottom die when the top die is placed on the bottom die. The warpage of the top die may raise serious problems. First, the warpage may cause the top die not to be completely flat when placed on the bottom die. If not properly treated, weak bonding strength or even unbonded areas may result from the warpage. In addition, an unfavorable gap or void may also be formed between the top die and bottom die, which substantially undermines the structural stability of the resulted semiconductor package.

In accordance with some aspects of the disclosure, a novel pick-and-place tool is provided. The pick-and-place tool includes at least one warpage-correction mechanism. The warpage-correction mechanism is operable to apply a downward force to a corner region or a side region of the top die to correct the warpage of the top die. Using the warpage-correction mechanism, the top die can be flattened and form a flat and tight interface between the top die and the bottom die. In addition, the warpage-correction mechanism can eliminate the gap between the top die and the bottom die, assure a sufficient bonding strength of the bonded dies, and improve the overall performance of the resulted semiconductor package.

Details of various aspects of the disclosure will be described below in detail with reference to FIGS. 1-14B.

Example Pick-and-Place Tool and Operations Thereof

FIG. 1 is a schematic diagram illustrating a cross-sectional view of an example pick-and-place tool 100 in accordance with some embodiments. In the example shown in FIG. 1, the pick-and-place tool 100 includes a wafer holder 102, a primary drive mechanism 110, an attaching shaft 112, a gantry 114, a secondary drive mechanism 116, a suction head 120, a suction shaft 130, a vision alignment camera 126, a vacuum device 132, and warpage-correction mechanism 190 (sometimes also referred to as "warpage-correction system" or "warpage-correction structure").

As will be discussed in detail below with reference to FIGS. 2A-14B below, the warpage-correction mechanism 190 is configured to flatten a top die that is placed on and bonded to a bottom die by the pick-and-place tool 100; correct a warpage of the top die; eliminate a gap between the top die and bottom die; cause the bonding layers of the top die and the bottom die to form a flat interface; and improve the bonding strength between the top die and the bottom die. In some embodiments, as will be discussed below with reference to FIGS. 2A-9D, the warpage-correction mechanism 190 includes a pushing mechanism 190*a* or 190*a*'. In other embodiments, as will be discussed below with reference to FIGS. 10A-13, the warpage-correction mechanism 190 includes a rolling mechanism 190*b*. It should be understood that these embodiments are not intended to be limiting, and the warpage-correction mechanism 190 can be implemented in other manners in other embodiments.

It should be understood that more or fewer components than those shown in FIG. 1 can be employed in other examples. For example, the pick-and-place tool 100 may further include a control unit, a vision alignment processor, a memory device, a display, and an I/O device in other embodiments. In the example shown in FIG. 1, the pick-and-place tool 100 can pick a top die 106, which typically comes from a component wafer on a frame after a dicing process, and place the top die 106 on a bottom die 104, which is disposed on a wafer.

The wafer holder 102 is used to hold the wafer on which the bottom die 104 is disposed. It should be understood that the techniques discussed in the disclosure can be applied to the die-to-die bonding context and the die-to-wafer bonding context.

In the example shown in FIG. 1, the bottom die 104 has a front side (denoted as "F" in FIG. 1) and a back side (denoted as "B" in FIG. 1). In the example shown in FIG. 1, the bottom die 104 has been flipped, i.e., upside down. A bonding layer 156 is formed at the back side and on a silicon substrate 150. In one implementation, the bonding layer 156 is made of a dielectric and can be used for bonding with another bonding layer 156 at the top die 106.

One or more semiconductor devices (e.g., transistors, resistors, capacitors, inductors, etc.) are formed on the silicon substrate 150, before being flipped, in a front-end-of-line (FEOL) process. A multilayer interconnect (MLI) structure 152 is disposed over the one or more semiconductor devices, before being flipped. The MLI structure 152 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 152. During operation of bottom die 104, the interconnect structures are configured to route signals and/or distribute signals (e.g., clock signals, voltage signals, ground signals) to the one or more semiconductor devices to fulfill certain functions. It should be understood that although the MLI structure 152 is depicted in FIG. 1 with a given number of dielectric layers and conductive layers, the present disclosure contemplates MLI structures having more or fewer dielectric layers and/or conductive layers depending on design requirements of the bottom die 104.

In the example shown in FIG. 1, the bottom die 104 includes a hybrid bonding metal pad 158 formed in the bonding layer 156, and the hybrid bonding metal pad 158 is connected to the MLI structure 152 through a through-silicon via (TSV) 154, which penetrates the silicon substrate 150 in a vertical direction (i.e., a Z-direction). It should be understood that although only one hybrid bonding metal pad 158 and one TSV 154 are shown in FIG. 1, this is not intended to be limiting.

Likewise, the top die 106 has a front side (denoted as "F" in FIG. 1) and a back side (denoted as "B" in FIG. 1). In the example shown in FIG. 1, the top die 106 has been flipped, i.e., upside down. The silicon substrate 150 of the top die 106 is held (e.g., sucked) to and in contact with the suction head 120, details of which will be described below. A bonding layer 156 is formed at the front side and over a MLI structure 152, before the top die 106 is flipped. In one implementation, the bonding layer 156 is made of a dielectric and can be used for bonding with the bonding layer 156 at the bottom die 104, as mentioned above. Likewise, the top die 106 includes a hybrid bonding metal pad 158 formed in the bonding layer 156, and the hybrid bonding metal pad 158 is connected to the MLI structure 152 through, for example, a via. It should be understood that although only one hybrid bonding metal pad 158 and a TSV 154 are shown in FIG. 1, this is not intended to be limiting.

The top die 106 is picked by the suction head 120, and then the pick-and-place tool 100 controls the suction head 120 accordingly to move the top die 106 to a target position, for example, right over the bottom die 104. Subsequently, the suction head 120 places the top die 106 onto the bottom die 104. The top die 106 and the bottom die 104 are bonded because of the bonding layers 156 on each side, in some implementations at room temperatures. In the meantime, the hybrid bonding metal pads 158 on each side are in contact with each other, forming an electrical connection path between the top die 106 and the bottom die 104.

The primary drive mechanism 110 and the gantry 114 are connected through the attaching shaft 112. The primary drive mechanism 110 can drive the gantry 114 both in the vertical direction (i.e., the Z-direction) and in the horizontal plane (i.e., the X-Y plane, that is in the X-direction and/or the Y-direction). In one implementation, the primary drive mechanism 110 is an actuator, a rail, a continuous track, a stepper motor, gears, belts, or a combination thereof. It should be understood that this is not intended to be limiting, and other implementations of the primary drive mechanism 110 are within the scope of the disclosure.

The gantry 114 and the suction head 120 are connected through the suction shaft 130. A secondary drive mechanism 116 is located at the gantry 114 and can drive the suction head 120 both in the vertical direction (i.e., the Z-direction) and in the horizontal plane (i.e., the X-Y plane, that is in the X-direction and/or the Y-direction). In one implementation, the secondary drive mechanism 116 is an actuator, a stepper motor, or a combination thereof. In another implementation, the secondary drive mechanism 116 drives the suction head 120 by using magnetic forces. It should be understood that this is not intended to be limiting, and other implementations of the secondary drive mechanism 116 are within the scope of the disclosure.

The vision alignment camera 126 is located at the gantry 114. The vision alignment camera 126 is a downward camera that can detect the exact position of the gantry 114 relative to the bottom die 104. A vision alignment processor may be utilized to assist the primary drive mechanism 110 in driving the gantry 114 to a target gantry position. In some embodiments, some alignment patterns can be formed on the bottom die 104. The vision alignment processor and the vision alignment camera 126 can utilize the alignment patterns to adjust the position of the gantry 114 accordingly to achieve an accurate landing of the top die 106.

The vacuum device 132 is connected to the suction shaft 130 through a pipe 134. The suction shaft 130 is hollow and has a passage in the middle that extends in the Z-direction. When the vacuum device 132 operates, the suction head 120 generates a suction force to hold the top die 106 to a bonder region 122 of the suction head 120. In some embodiments, the suction head 120 may also include an auxiliary region, which accommodates an optics alignment system. The optics alignment system is configured to assist the suction head 120 to adjust its position accordingly and place the top die 106 at the target position, with the help of a control unit. The control unit is configured to execute computer program codes stored in a memory device in order to cause the pick-and-place tool 100 to fulfill its various functions. It should be understood that the vision alignment processor can be a portion of the control unit in some embodiments.

Example Pushing Mechanism and Operations Thereof

Figures 2A, 2B:
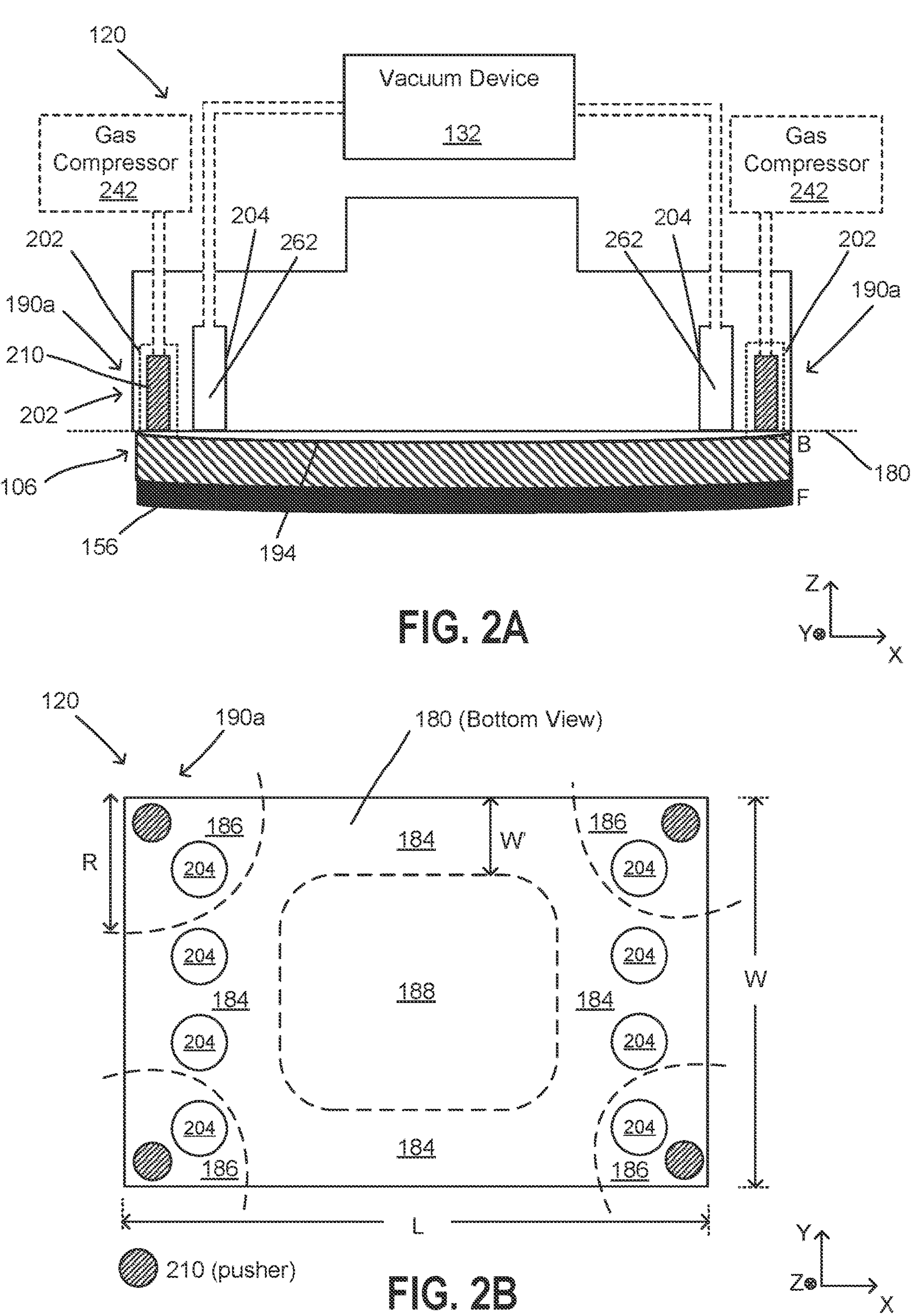
FIG. 2A is a schematic diagram illustrating a cross-sectional view of an example suction head in accordance with some embodiments.
FIG. 2B is a schematic diagram illustrating a bottom view of the suction head of FIG. 2A in accordance with some embodiments.

FIGS. 2A-2B illustrate an example of a suction head 120 that includes a pushing mechanism **190*a*. FIG. 2A is a schematic diagram illustrating a cross-sectional view of suction head 120 in accordance with some embodiments. FIG. 2B is a schematic diagram illustrating a bottom view of the suction head 120 of FIG. 2A in accordance with some embodiments. One of ordinary skill in the art would recognize many variations, modifications, and alternatives within the contemplation of the present disclosure. It should also be understood that FIGS. 2A-2B** are not drawn to scale.

In the illustrated example, the suction head 120 has a pushing mechanism **190*a* and at least one suction unit 204. The suction unit 204 is configured to apply an upward suction force to the top die 106 to pick and hold the top die 106 during a die-to-die or die-to-wafer bonding process. The pushing mechanism 190*a* includes at least one pushing unit 202. Each pushing unit 202 has a pusher 210 extending vertically in the Z-direction. The pusher 210 is movable vertically and configured to move downwardly under control to protrude out of a bottom surface 180 of the suction head 120 and push against a bottom surface 194 of the top die 106 when the top die 106 is placed on the bottom die 104. Details of the pushing unit 202 will be discussed below with reference to FIGS. 5A-9B**.

The suction unit 204 may have a suction chamber (not shown) operably connected to and in gas communication with the vacuum device 132 of the pick-and-place tool 100. The vacuum device 132 is configured to produce a low pressure in the suction chamber and apply an upward suction force on the top die 106, such that the top die 106 can be picked and held by the suction head 120.

As shown in FIG. 2B, the bottom surface 180 of the suction head 120 has a rectangular or substantially rectangular geometry in the X-Y plane, although other geometries are also possible in alternative embodiments. The suction head 120 has a central region 188 and a side region 184 (sometimes also referred to as a "peripheral region"). The side region 184 is continuously laterally surrounding an outer perimeter of the central region 188. The side region 184 has a width (W') of about 5% to about 40%, relative to a length (L) or a width (W) of the bottom surface 180. The side region 184 further includes multiple corner regions 186 respectively corresponding to the corners of the bottom surface 180, and each corner region 186 has a radius (R) of about 5% to about 25%, relative to the length (L) or the width (W) of the bottom surface 180.

In some embodiments, the pushing mechanism **190*a* includes multiple pushing units 202, and at least one pushing unit 202 is located in each one of the corner regions 186. The multiple pushing units 202 may form a symmetrical pattern. In the illustrated example, the pushing mechanism 190*a* includes 4 pushing units 202 respective located in the 4 corner regions 186. In some embodiments, the pushing mechanism 190*a* may include at least one additional pushing unit 202 located in the side region 184 outside the corner region 186**.

The suction units 204 may be arranged in a pattern and located in the side region 184. In some embodiments, two arrays of the suction units 204 are arranged along the Y-direction and located in two opposing segments of the side region 184, respectively. Four of these suction units 204 are also located in the four corner regions 186, respectively. In this arrangement, a pushing unit 202 is proximate to a suction unit 204 in the corresponding corner region 186. It is noted that the illustrated examples in FIG. 2B is not intended to be limiting, and the number, pattern, and exact location of the pushing units 202 and the suction units 204 may vary, depending on design requirements.

The bottom surface 180 of the suction head 120 may be geometrically comparable to the top die 106, with a deviation of about 0 to about 10% in dimension. Accordingly, the top die 106 may have a central portion corresponding to the central region 188 of the suction head 120, an edge portion corresponding to the side region 184 of the suction head 120, and multiple corner portions respectively corresponding to the corner regions 186 of the suction head 120. During the die-to-die bonding process, the pusher 210 of the pushing unit 202 in a corner region 186 is controlled to push against the corresponding corner portion of the top die 106 and apply a downward force thereon.

FIG. 3 is a flowchart diagram illustrating an example method 350 for operating the suction head 120 in accordance with some embodiments. FIGS. 4A-4D are schematic diagrams illustrating cross-sectional views of the suction head 120 at various operational stages of the method 350 in accordance with some embodiments. One of ordinary skill in the art would recognize many variations, modifications, and alternatives within the contemplation of the present disclosure. It should also be understood that FIGS. 4A-4D are not drawn to scale.

As shown in FIG. 3, the method 350 includes operations 352, 354, 356, and 358. Additional operations may be performed. Also, it should be understood that the sequence of the various operations discussed above with reference to FIG. 3 is provided for illustrative purposes, and as such, other embodiments may utilize different sequences. These various sequences of operations are to be included within the scope of embodiments.

Figures 4A, 4B, 4C, 4D:
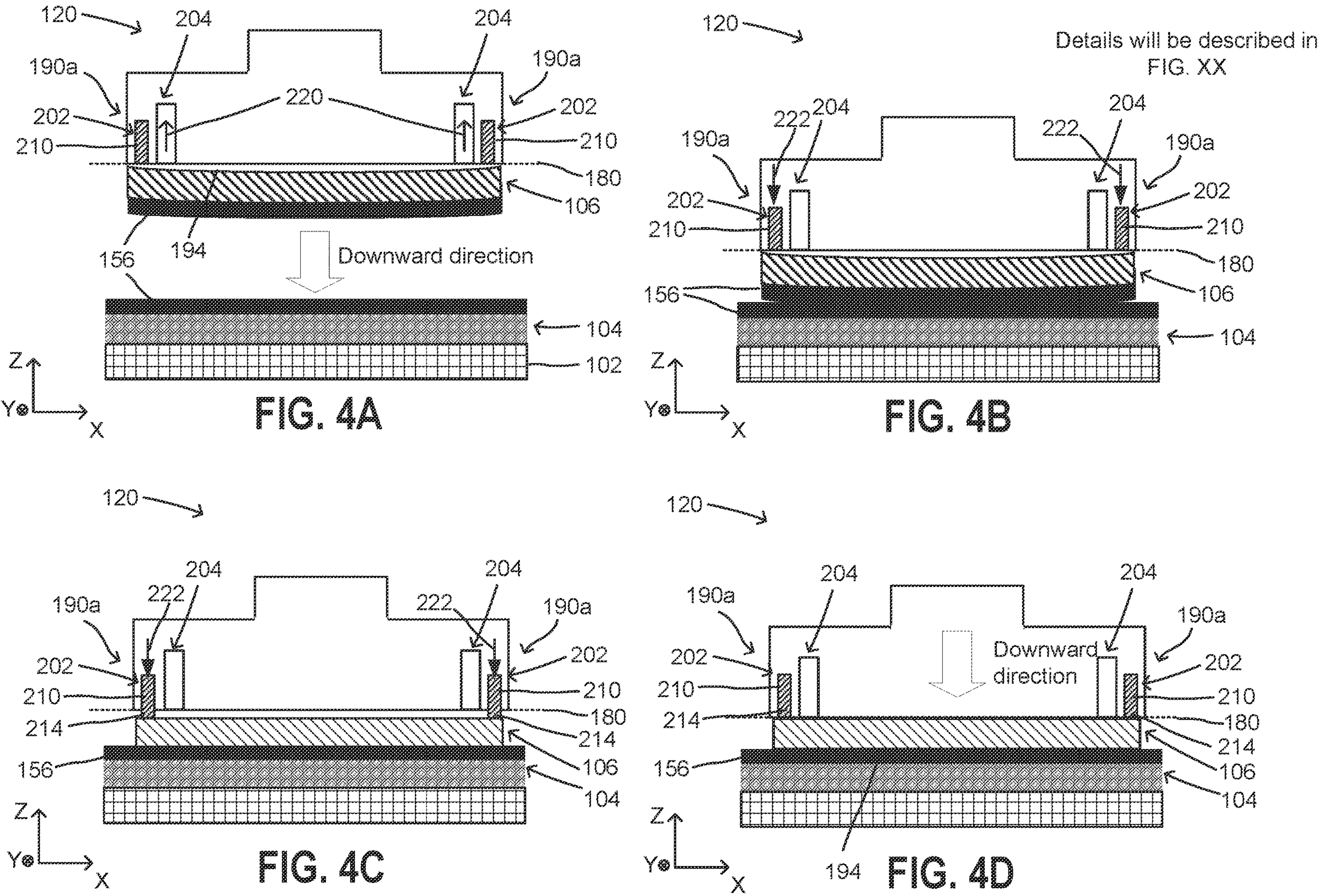
FIGS. 4A-4D are schematic diagrams illustrating various cross-sectional views of an example suction head in accordance with some embodiments.

At operation 352, a top die is picked and held by a suction head of a pick-and-place tool and is controlled to move downwardly toward a bottom die held by a wafer holder. A configuration of the suction head at operation 352 is illustrated in FIG. 4A. As illustrated, the suction units 204 apply an upward suction force 220 to cause the suction head 120 to pick and hold the top die 106. The top die 106 has a warpage with a gap between the bottom surface 194 of the top die 106 and the bottom surface 180 of the suction head 120. The gap has a size that is larger in the central region 188 and gradually decreases in a radial direction from the central region 188 to the side region 184. The suction head 120 is controlled to move downwardly to allow the top die 106 to approach the bottom die 104. At operation 352, the pusher 210 of the pushing unit 202 is at a starting position (sometimes also referred to as an "original position"), where the pusher 210 remains in the suction head 120 above the bottom surface 180 in the Z-direction.

At operation 354, the suction head 120 is controlled and adjusted to cause the top die to engage with the bottom die. A configuration of the suction head 120 at operation 354 is illustrated in FIG. 4B. In some implementations, the bonding layer 156 of the top die 106 is contacted with the bonding layer 156 of the bottom die 104 in the central region 188. It is noted that in some embodiments, the top die 106 and the bottom die 104 may not be in complete contact in the side region 184 and the corner region 186, due to the warpage of the top die 106. Prior to the operation 356, the upward suction force 220 is removed to allow the top die 106 to be placed on the bottom die 104 naturally.

At operation 356, a pushing mechanism is actuated to cause a pusher to press against the top die and apply a downward force to a corner portion of the top die. A configuration of the suction head 120 at operation 356 is illustrated in FIG. 4C. The pushing mechanism 190*a* is actuated to control the pusher 210 of the pushing unit 202 to move downwardly. The pusher 210 may protrude out of bottom surface 180 to directly push against the top die 106. The pusher 210 applies a downward force 222 on the corner portion of the top die 106, and the downward force 222 is sufficiently high to overcome the internal stress of the top die 106 and correct the warpage. Accordingly, the top die 106 is pushed by the pusher 210 to contact with the bottom die 104 across the entire region of the top die 106. In some implementations, the strength and time of the downward force 222 can be adjusted, such that the top die 106 is flattened and forms a flat interface with the bottom die 104. Accordingly, the bonding layers 156 of the top die 106 and bottom die 104 are contacted across the entire region of the top die 106.

At operation 358, the suction head 120 is controlled to move downwardly and press the entire top die 106 to cause the top die 106 to bond to the bottom die 104, as illustrated in FIG. 4D. In some implementations, the pusher 210 is retracted to return to the starting position to remove the downward force 222 prior to the operation 358. Upon pressing, the bottom surface 180 of the suction head 120 is directly contacted with the entire bottom surface 194 of the top die 106, such that the gap therebetween is eliminated. Consequently, the top die 106 is flattened and entirely bonded to the bottom die 104 to form a flat interface between the bonding layers 156. Thus, the bonding strength between the top die 106 and the bottom die 104 is thereby assured.

In some implementations, a pressure between the top die 106 on the bottom die 104 (hereinafter referred to as "the pressure") is measured. A displacement of the suction head relative to the bottom die 104 can be determined based on a relationship between the pressure and the displacement. The downward force 222 applied to the top die 106 can be adjusted based on the determined displacement to assure a sufficient bonding strength between the bonding layers 156. Details will be described below with reference to FIGS. 14A-14B.

Figures 5A, 5B:
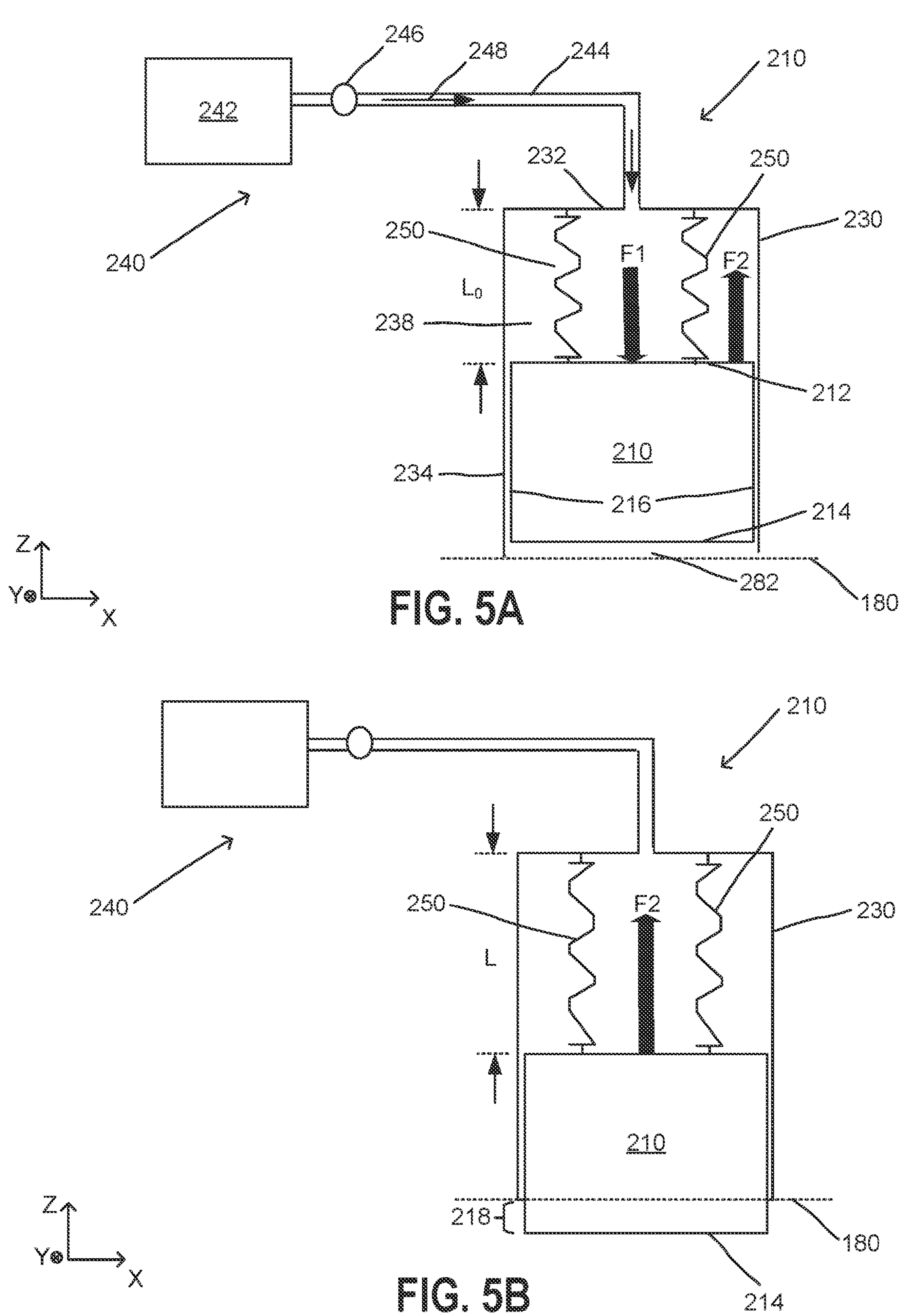
FIGS. 5A-5B are schematic diagrams illustrating various cross-sectional views of an example pushing unit in accordance with some embodiments.

FIGS. 5A-5B illustrate an example of the pushing unit 202 in accordance with some embodiments. FIG. 5A is a schematic diagram illustrating a cross-sectional view of the example pushing unit 202 in a starting configuration. FIG. 5B is a schematic diagram illustrating a cross-sectional view of the example pushing unit 202 in an ending configuration.

In the illustrated example, the pushing unit 202 has a tubular chamber 230 and a pusher 210. The tubular chamber 230 extends vertically from a tubular chamber top wall 232 to an opening 282 at the bottom surface 180 of the suction head 120. The tubular chamber 230 has a tubular chamber side wall 234 circumferentially connected to the tubular chamber top wall 232. The tubular chamber 230 has an internal space 238 defined by the tubular chamber top wall 232, the tubular chamber side wall 234, and the bottom surface 180 of the suction head 120. The pusher 210 is disposed in the internal space 238. The pusher 210 vertically extends from a pusher top wall 212 to a pusher bottom wall 214. The pusher 210 further includes a pusher side wall 216 circumferentially connecting the pusher top wall 212 and the pusher bottom wall 214. When the pusher 210 is in a starting position (sometimes also referred to as an "original position"), the pusher 210 is within the internal space 238, and the pusher bottom wall 214 is co-planar with or above the bottom surface 180 of the suction head 120. The pusher side wall 216 is in air-tight contact with the tubular chamber side wall 234. The pusher 210 is movable in the tubular chamber 230 along the Z-direction under an external force. The pusher 210 may be solid or may have a hollowed structure.

In some embodiments, the tubular chamber 230 is operably connected to a pneumatic system 240 configured to drive and control the pusher 210 to move vertically. The pneumatic system 240 includes, among other components, a gas compressor 242, a compressor pipe 244, and a compressor valve 246. The compressor pipe 244 connects the gas compressor 242 and the tubular chamber 230. The gas compressor 242 is configured to provide a pressurized gas flow 248 to the tubular chamber 230 through the compressor pipe 244. The pressurized gas flow 248 could exert a downward force F1 to the pusher top wall 212 to drive the pusher 210 to move downwardly. The pressurized gas flow 248 can be controlled by the compressor valve 246 to adjust the value of the downward force F1. The downward force F1 may be adjustable, e.g., by tuning the parameters of the pneumatic system such as the gas pressure and gas flow rate. It should be understood that the pneumatic system 240 is for illustrative purpose only and is not intended to be limiting, other power supply mechanisms such as an electric motor may also be used to drive and control the pusher 210.

In some embodiments, the pushing unit 202 includes a retracting mechanism 250 configured to retract the pusher 210 and cause it to return to the starting position. In some embodiments, the retracting mechanism 250 includes at least one spring as illustrated in FIGS. 5A-5B. The spring connects the tubular chamber top wall 232 of the tubular chamber 230 and the pusher top wall 212. When the pusher 210 is in the starting position, the spring has an original length ($L_0$). When the pusher 210 moves downward, the spring is elongated and exerts an upward force F2 on the pusher 210. The strength of the upward force F2 is proportional to the elongation or displacement, e.g., the difference between the length (L) of the spring and its original length ($L_0$), or "$L-L_0$". It is noted that F2 is sufficiently smaller than F1 in value, such that the pusher 210 may continue to move downwardly under the influence of F1.

As shown in FIG. 5B, the pusher 210 may have a bottom portion 218 that protrudes out of the bottom surface 180 of the suction head 120 and directly pushes against the top die 106 at the ending position. When the pushing step is completed, the pressurized gas flow 248 is ceased to remove the downward force F1, and the upward force F2 becomes predominant. The F2 may overcome the gravity of the pusher 210 and cause the pusher 210 to retract back into the tubular chamber 230 and return to the starting position. It should be understood that the spring in the illustrated example is not intended to be limiting, other techniques may also be employed in the retracting mechanism 250.

Figures 6A, 6B:
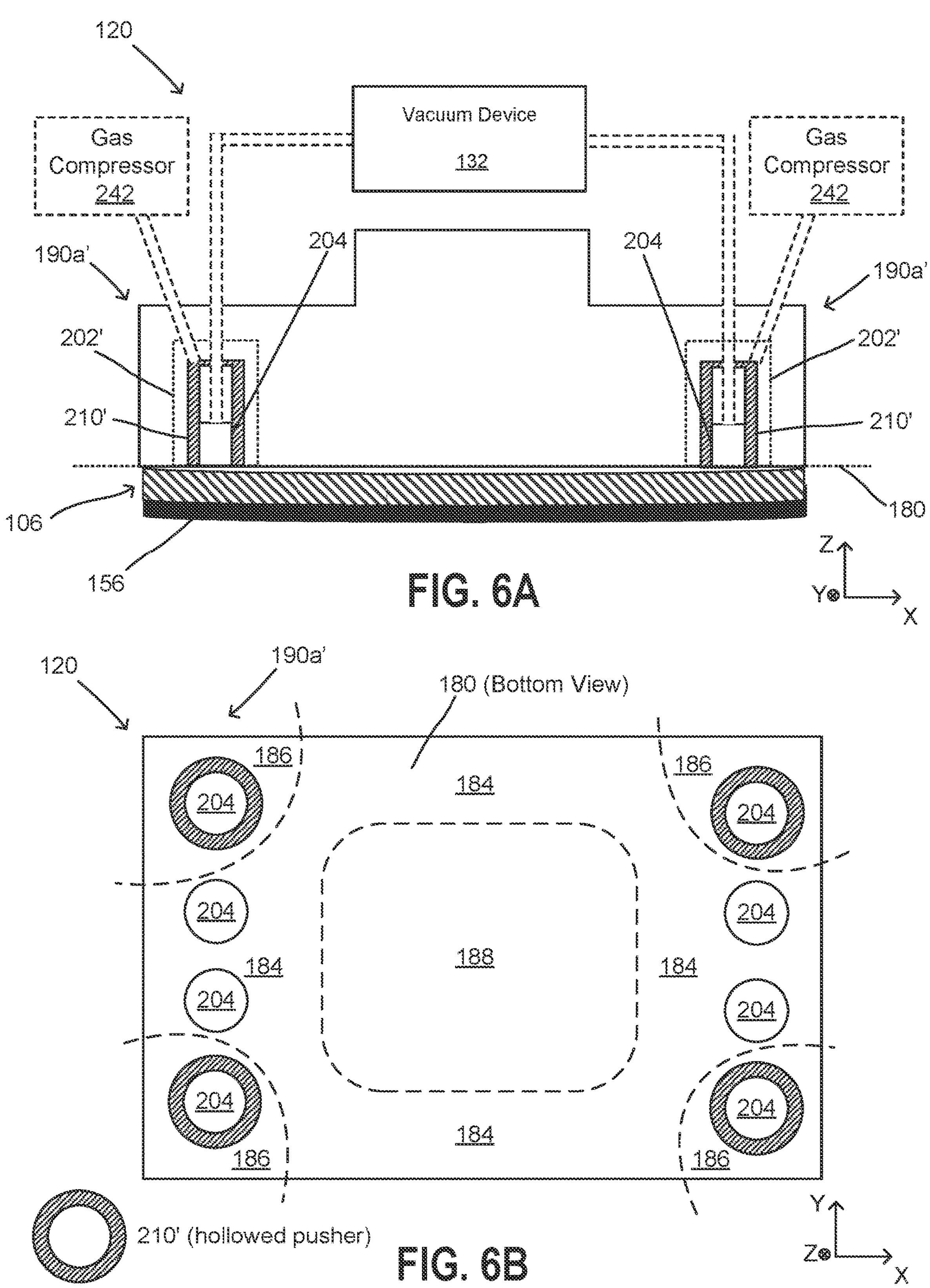
FIG. 6A is a schematic diagram illustrating a cross-sectional view of an example suction head in accordance with some embodiments.
FIG. 6B is a schematic diagram illustrating a bottom view of the suction head of FIG. 6A in accordance with some embodiments.
Figures 7A, 7B:
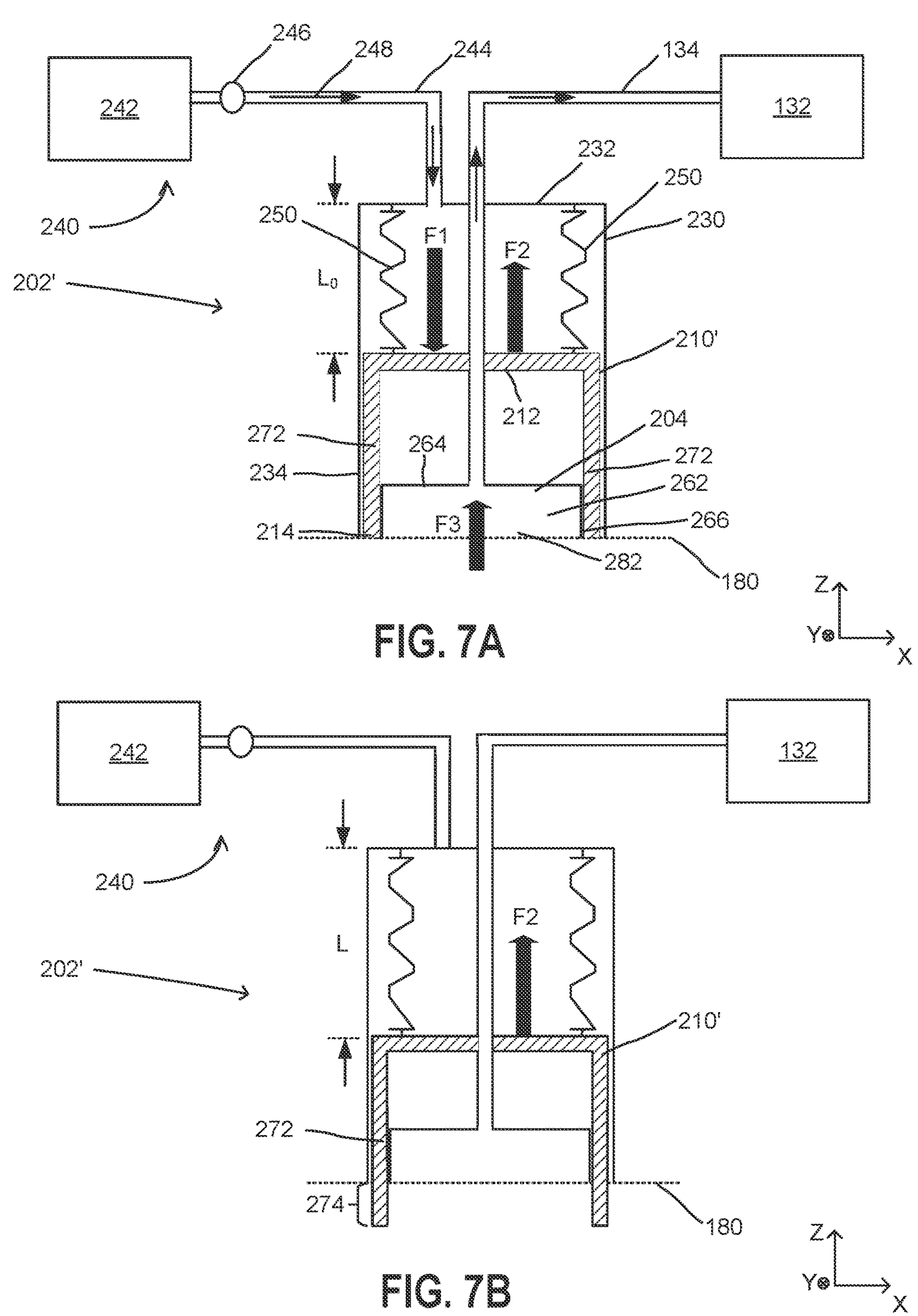
FIGS. 7A-7B are schematic diagrams illustrating various cross-sectional views of an example pushing mechanism in accordance with some embodiments.

FIGS. 6A-7B illustrate another example of the suction head 120 having a pushing mechanism 190*a*'. The pushing mechanism 190*a*' is a close variation of the pushing mechanism 190*a* shown in FIGS. 5A-5B. FIG. 6A is a schematic diagram illustrating a cross-sectional view of the suction head 120. FIG. 6B is a schematic diagram illustrating a bottom view of the suction head 120 of FIG. 6A. FIG. 7A is a schematic diagram illustrating a cross-sectional view of the pushing mechanism 190*a*' in a starting configuration. FIG. 7B is a schematic diagram illustrating a cross-sectional view of the pushing mechanism 190*a*' in an ending configuration.

Compared with the pushing mechanism 190*a*, the pushing mechanism 190*a*' has an integrated pushing unit 202'. The integrated pushing unit 202' includes a hollowed pusher 210' that encloses the suction chamber 262 about a central axis in the Z-direction, such that the hollowed pusher 210' and the suction unit 204 are concentric. This integrated design allows to save space of the suction head and may provide advantages in handling top dies with small dimensions.

Similar to the pushing mechanism 190*a*, the pushing mechanism 190*a*' may include multiple integrated pushing units 202', as shown in FIG. 6B. At least one integrated pushing unit 202' is disposed in each of corner regions 186 of the suction head 120. In some embodiments, the integrated pushing unit 202' is aligned with other suction units 204 in a row or a column in the X-Y plane. It should be understood that the pushing mechanism 190*a*' may include additional integrated pushing units 202' disposed outside the corner regions 186, e.g., in the side region 184 and the central region 188, and the number and exact location of the integrated pushing units 202' may vary depending on design requirements. The pushing mechanism 190*a*' may be operated in a similar manner to the pushing mechanism 190*a*, e.g., by implementing the method 350 as described above.

In the illustrated example of FIG. 7A, the integrated pushing unit 202' includes, among other components, a tubular chamber 230, a hollowed pusher 210', and a suction chamber 262 of the suction unit 204. The tubular chamber 230, the hollowed pusher 210', and the suction chamber 262 are concentric along a central axis in the Z-direction. The tubular chamber 230 has been described above and will not be repeated. The suction chamber 262 extends from a suction chamber top wall 264 to an opening 282 at the bottom surface 180 of the suction head 120. The suction chamber 262 has a suction chamber side wall 266 circumferentially connected to the suction chamber top wall 264. The hollowed pusher 210' extends from a pusher top wall 212 to the bottom surface 180 and includes a pusher side wall 272 circumferentially connected to the pusher top wall 212. A bottom portion 274 of the pusher side wall 272 is disposed between and in air-tight contact with the tubular chamber side wall 234 and the suction chamber side wall 266. The pusher side wall 272 is capable of moving vertically between the tubular chamber side wall 234 and the suction chamber side wall 266, under an external force, e.g., provided by a pneumatic system 240. The distance between the pusher top wall 212 and the suction chamber top wall 264 is sufficiently long to allow the pusher side wall 272 to move downwardly and reach the top die 106.

During operation, a low pressure is generated in the suction chamber 262 to apply an upward suction force F3 on the top die 106 and allow the suction head 120 to pick and hold the top die 106. When the top die 106 is placed on the bottom die 104, the suction force F3 is removed, and a downward force F1 is applied on the pusher top wall 212 of the hollowed pusher 210' to cause the hollowed pusher 210' to move downwardly, in a similar manner to the pushing mechanism 190*a*. At the ending position, the bottom portion 274 of the pusher side wall 272 protrudes out of the bottom surface 180 and directly presses the corner portions of the top die 106, as shown in FIG. 7B. When the pushing step is completed, the downward force F1 is removed, and the upward retracting force F2 generated by the spring causes the hollowed pusher 210' to return to the starting position.

Figures 8A, 8B:
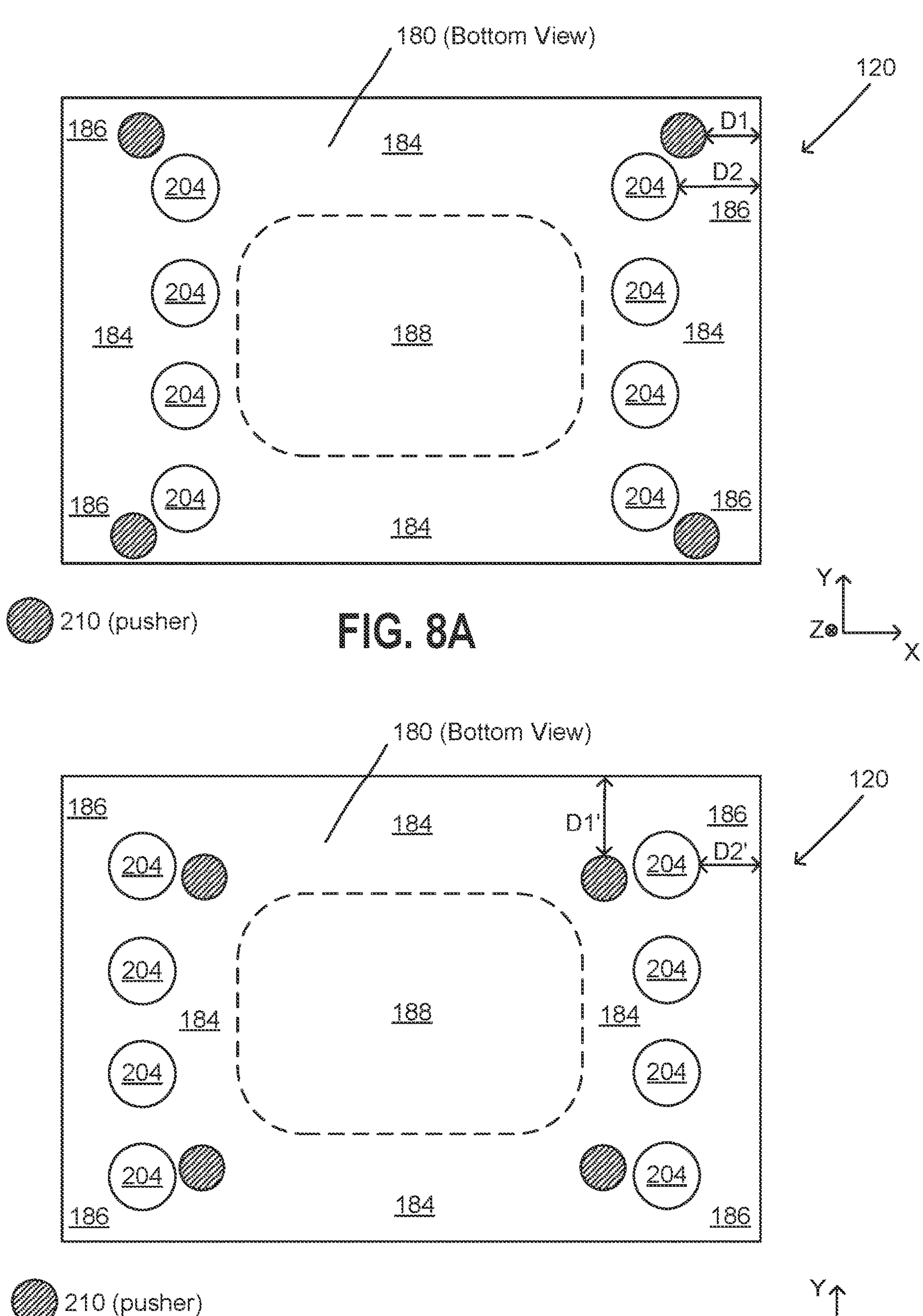
FIGS. 8A-8B are schematic diagrams illustrating bottom views of various examples of a suction head in accordance with some embodiments.

FIGS. 8A-8B illustrate further examples of the suction head 120. FIG. 8A is a schematic diagram illustrating a bottom view of an example of suction head 120 in accordance with some embodiments. FIG. 8B is a schematic diagram illustrating a bottom view of another example of suction head 120 in accordance with some embodiments. In the example of FIG. 8A, the pushers 210 are farther away from the central region 188, as compared with the suction units 204. In some embodiments, the pushers 210 are respectively disposed in the corner regions 186, and an edge distance of the pusher measured between the pusher 210 and the closest edge of the suction head 120 is defined as D1. The suction units 204 are arranged in two columns along the width (W) of the bottom surface 180 and respectively disposed in the side region 184. An edge distance of the suction unit measured between the suction unit 204 and the closest edge of the suction head 120 is defined as D2.

In some embodiments, D1 is not greater than D2. For example, D1 and D2 are in accordance with the following relationships: D1=D2 or D1<D2. In the illustrated example of FIG. 8B, the pushers 210 are closer to the central region 188 as compared with the suction units 204. In some embodiments, the edge distance (D1') of the pusher 210 is no less than the edge distance (D2') of the suction unit 204. For example, D1' and D2' are in accordance with the following relationships: D1'=D2' or D1'>D2'.

FIGS. 9A-9D are schematic diagrams illustrating bottom views of various examples of the suction head 120 in accordance with some embodiments. In the example illustrated in FIG. 9A, the suction head 120 includes multiple pushers 210 disposed in both the side regions 184 and the corner regions 186. In the illustrated example of FIG. 9B, the suction head 120 includes multiple pushers 210 of different types (e.g., type-1-pusher, type-2-pusher). In some embodiments, multiple type-1-pushers 210*a* are disposed in the corner regions 186, and multiple type-2-pushers 210*b* are disposed in the central region 188 along the width (W) of the bottom surface 180. The type-2-pusher 210*b* is composed of a material of higher hardness, as compared with the type-1-pusher 210*a*. The lower hardness of the type-1-pushers 210*a* may protect the top die from damage when the corner portions of the top die are pressed by the type-1-pushers 210*a*.

Figures 9A, 9B:
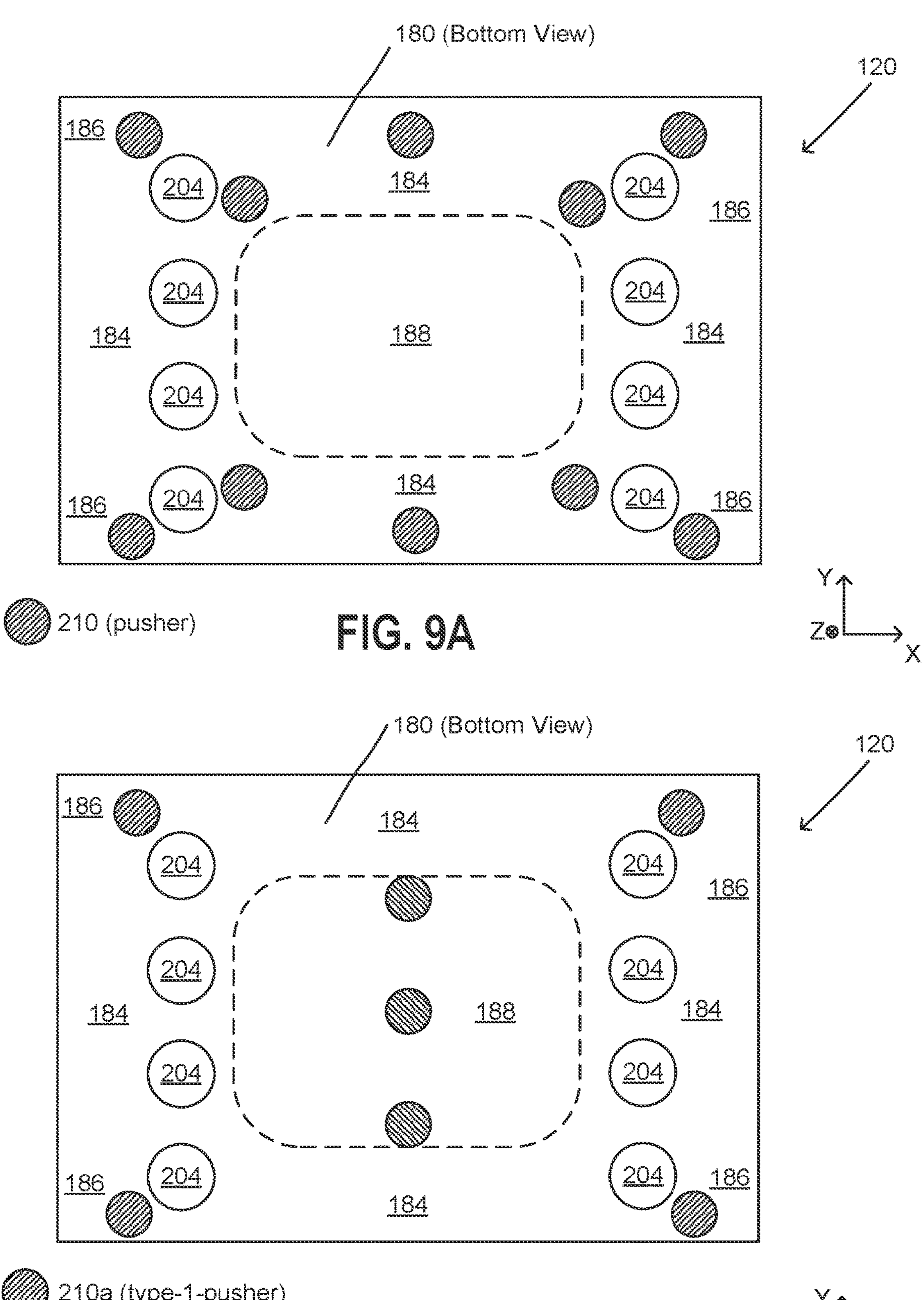
FIGS. 9A-9D are schematic diagrams illustrating bottom views of various examples of a suction head in accordance with some embodiments.
Figures 9C, 9D:
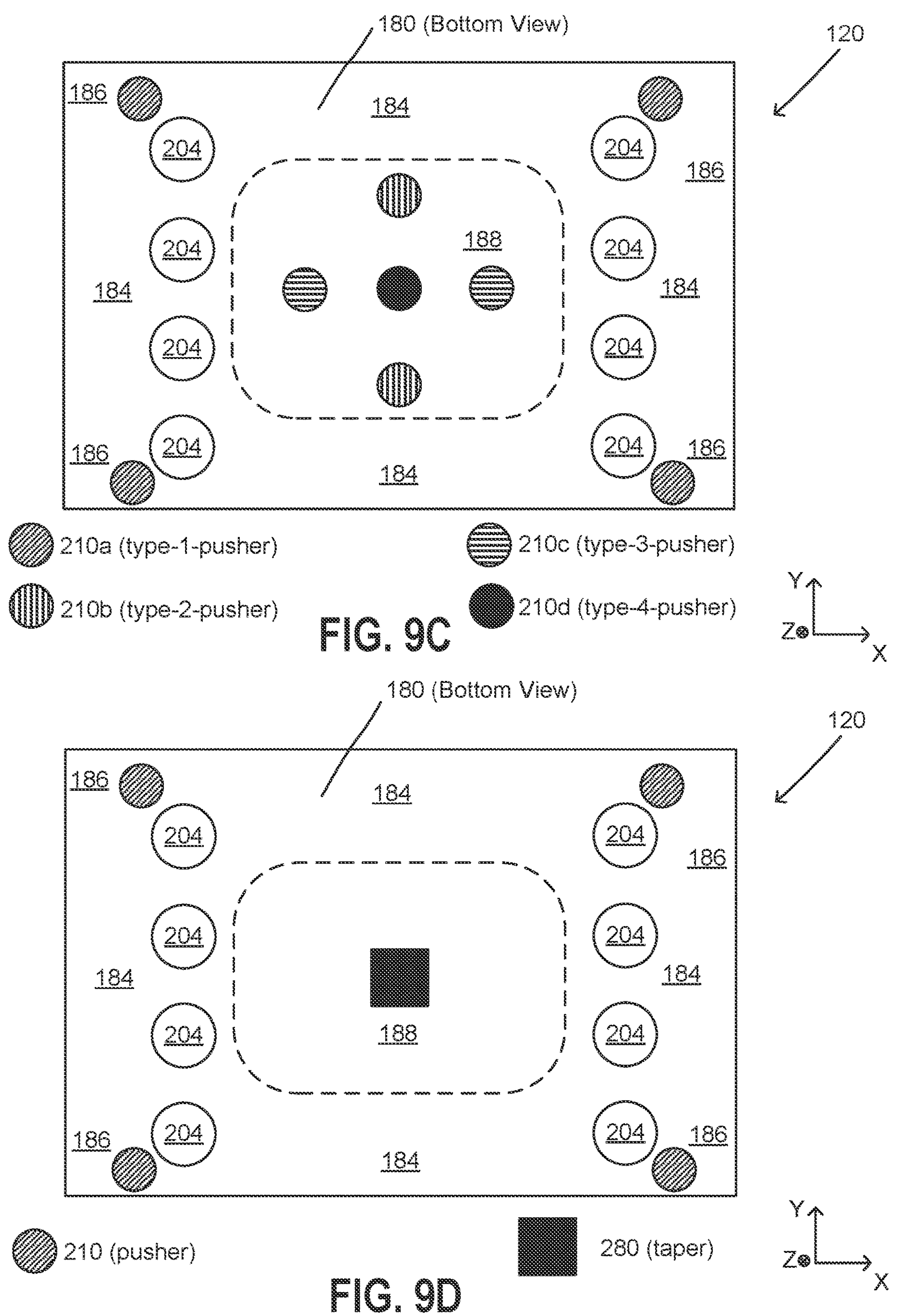

Similarly, in the illustrated example of FIG. 9C, the suction head 120 includes four type-1-pushers 210*a*, two type-2-pushers 210*b*, two type-3-pushers 210*c*, and a type-4-pusher 210*d*. The type-1-pushers 210*a* are disposed in the corner regions 186. The type-2-pushers 210*b* and the type-3-pushers 210*c* are disposed in the central region 188. The type-4-pusher 210*d* is disposed at a center point of the central region 188. The type-4-pusher 210*d* is surrounded by the type-2-pusher 210*b* and the type-3-pusher 210*c*. The pushers of different types may be composed of different materials or may have different hardness. In some embodiments, the hardness (H) of the pushers is in accordance with the following relationships: H (type-4-pusher)>H (type-3-pusher)>H (type-2-pusher)>H (type-1-pusher). In this arrangement, the hardness of the pushers gradually decreases from the central region 188 to the side region 184 and the corner regions 186.

In the illustrated example of FIG. 9D, the suction head 120 includes four pushers 210 disposed in the corner regions 186 and a taper 280 disposed at a center point of the central region 188. The taper 280 may protrude out of the bottom surface 180 in a fixed position and push against the central portion of the top die when the top die 106 is placed on the bottom die 104. The taper 280 may be used to fix the position of the top die and prevent the top die from displacement or deformation when the pushers 210 press the corner portions of the top die. It is noted that the examples shown in FIGS. 9A-9D are not intended to be limiting, and the pattern of the pushers and suction units can vary depending on design requirements.

Example Rolling Mechanism and Operations Thereof

Figure 10A:
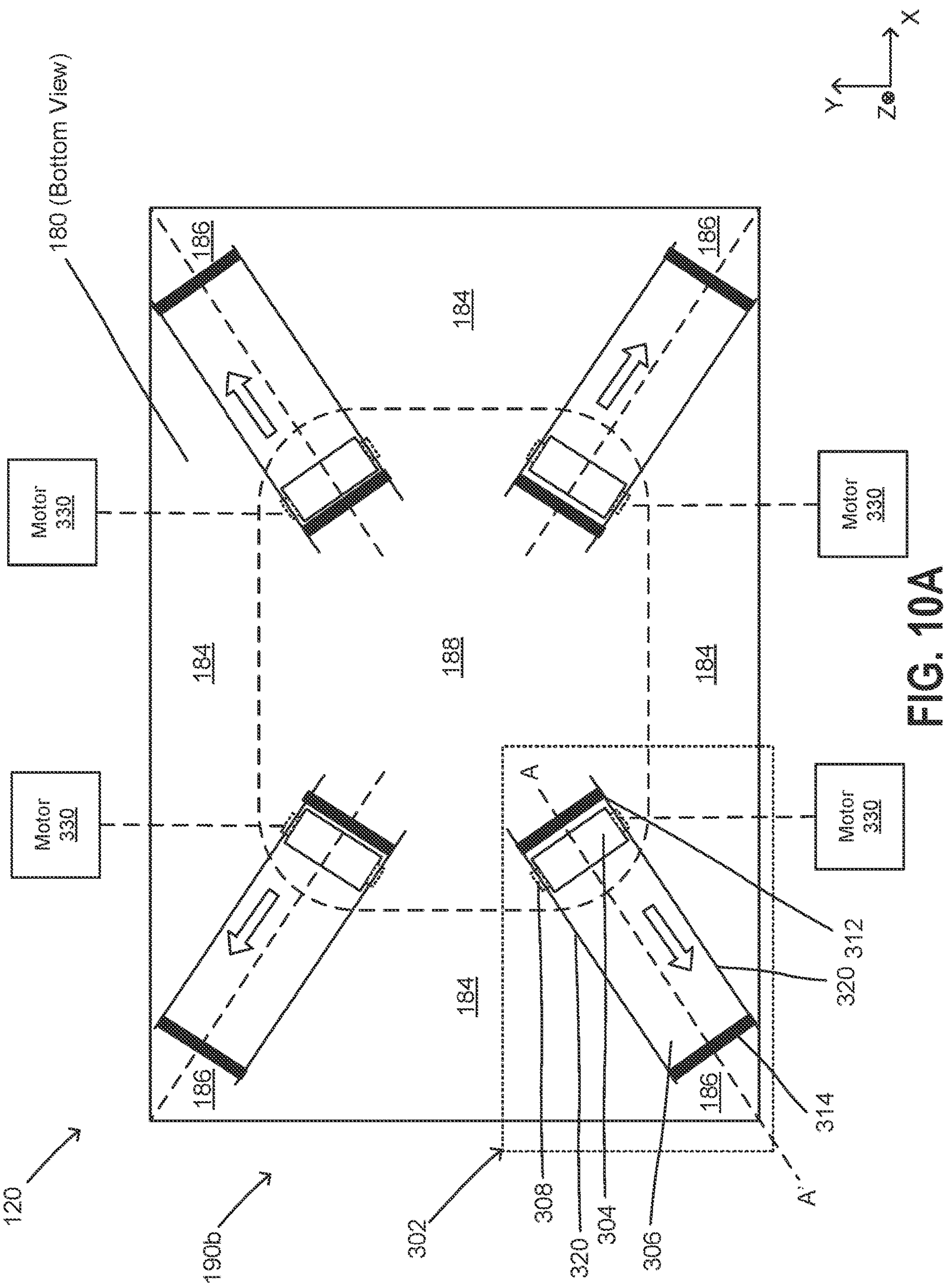
FIG. 10A is a schematic diagram illustrating a bottom view of an example suction head in accordance with some embodiments.
Figure 10B:
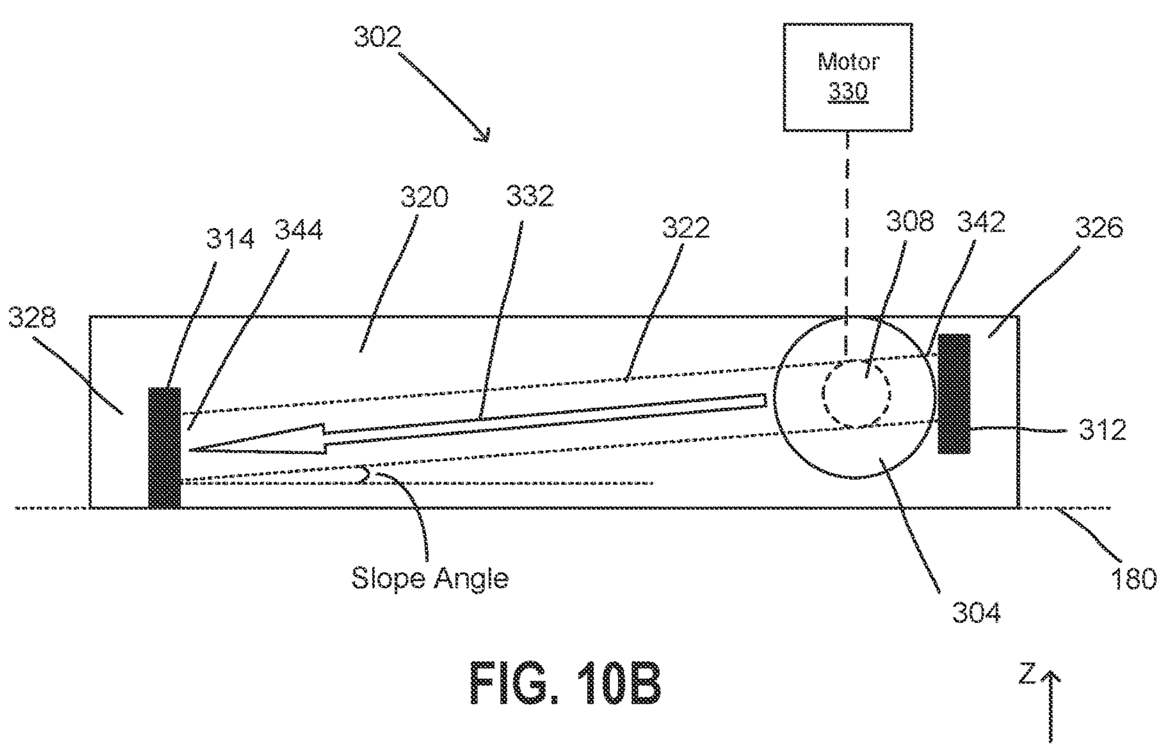
FIGS. 10B-10C are schematic diagrams illustrating various bottom views of the suction head of FIG. 10A along the line A-A' in accordance with some embodiments.
Figure 10C:
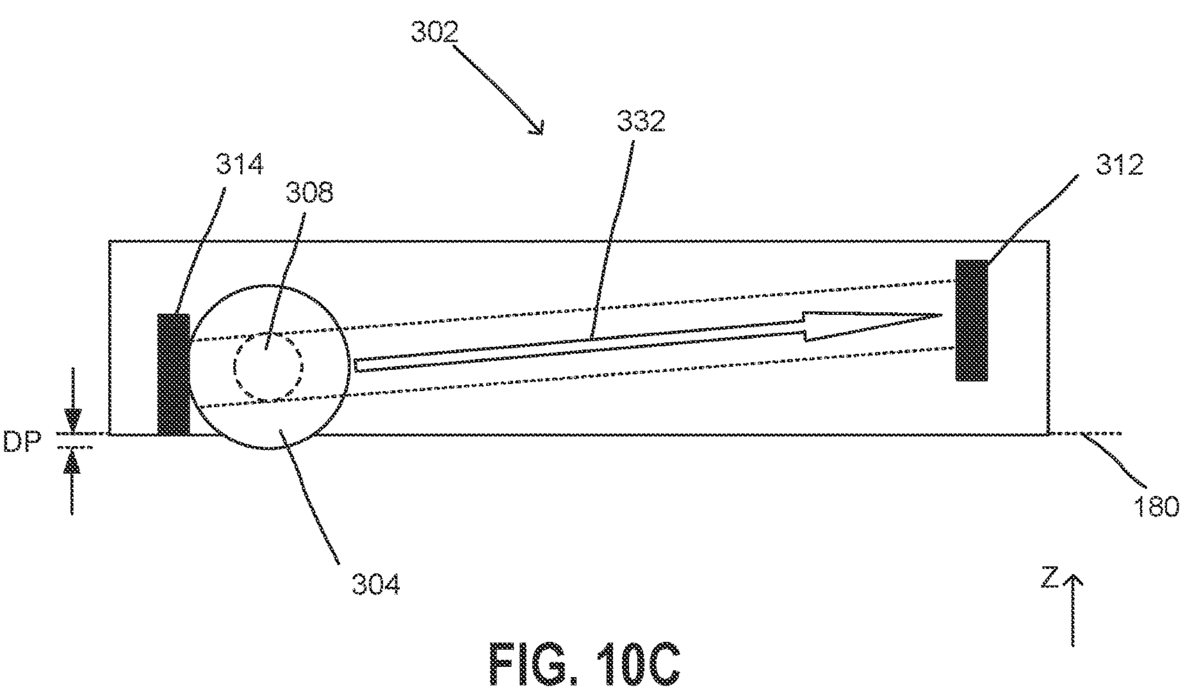

FIGS. 10A-10C illustrate an example of a suction head 120 having a rolling mechanism 190*b*. FIG. 10A is a schematic diagram illustrating a bottom view of the suction head 120 in accordance with some embodiments. FIG. 10B is a cross-sectional view of a rolling unit 302 at a starting configuration along the line A-A' of FIG. 10A in accordance with some embodiments. FIG. 10C is a cross-sectional view of a rolling unit 302 at an ending configuration along the line A-A' of FIG. 10A in accordance with some embodiments. One of ordinary skill in the art would recognize many variations, modifications, and alternatives within the contemplation of the present disclosure. It should also be understood that FIGS. 10A-10C are not drawn to scale.

In the illustrated example, the rolling mechanism 190*b* includes four rolling units 302 symmetrically distributed in the X-Y plane. Each rolling unit 302 includes, among other components, a roller 304, a drive shaft 308, a rolling track 306 defined by a pair of rolling track side walls 320, a pair of parallel grooves 322, a starting position stopper 312, and an ending position stopper 314.

The rolling track 306 extends from a higher end 326 disposed in the central region 188 to a lower end 328 in the corner region 186 along a longitudinal axis (e.g., the line A-A'). In some embodiments, the longitudinal axis of the rolling track 306 may be aligned with a diagonal of the bottom surface 180. In some embodiments, the rolling track 306 may extend from the central region 188 to the side region 184 along a longitudinal axis aligned with the X-direction or the Y-direction. The two rolling track side walls 320 are parallelly opposed to each other, defining a track width of the rolling track 306. The two grooves 322 are parallel to each other and respectively located on the two rolling track side walls 320. Each groove 322 extends from a higher groove end 342 to a lower groove end 344. The higher groove end 342 is proximate to the higher end 326 of the rolling track 306, and the lower groove end 344 is proximate to the lower end 328 of the rolling track 306. The higher groove end 342 is in an elevated position relative to the lower groove end 344, such that the two parallel grooves 322 form a slope relative to the bottom surface 180, as illustrated in FIGS. 10B-10C. In some embodiments, a slope angle between each of the two parallel grooves 322 and the bottom surface 180 is from about 1 degree to about 60 degrees, or from about 5 degrees to about 45 degrees, or from about 10 degrees to about 30 degrees.

The drive shaft 308 is disposed in the rolling track 306 and attached to the rolling track side walls 320. The drive shaft 308 extends from one end to another end along a central axis and is rotatable about the central axis thereof. The roller 304 is mounted on an outer surface of the drive shaft 308 and concentric with the drive shaft 308 along the central axis. The two ends of the drive shaft 308 are respectively jointed to and confined by the two parallel grooves 322. The drive shaft 308 is operably connected (schematically shown by the dashed lines shown in FIG. 10A) to a motor 330 configured to provide power to the drive shaft 308. Driven by the motor 330, the drive shaft 308 can rotatably move in both directions between the higher groove end 342 and the lower groove end 344 of the two parallel grooves 322. Thus, the two parallel grooves 322 define a sloped rolling path 332 in the rolling track 306 for the drive shaft 308 to move along. The sloped rolling path 332 has the same slope angle as the parallel grooves 322, relative to the bottom surface 180 of the suction head 120. Accordingly, the roller 304 mounted on and carried by the drive shaft 308 can move along the sloped rolling path 332 between the higher end 326 to the lower end 328 of the rolling track 306. In some embodiments, the roller 304 has a cylindrical geometry or shape. However, other geometries or shapes such as sphere and olive are also possible in alternative embodiments.

The starting position stopper 312 and the ending position stopper 314 are disposed in the rolling track 306 and further define the sloped rolling path 332 for the roller 304. The starting position stopper 312 is proximate to the higher end 326, and the ending position stopper 314 is proximate to the lower end 328. During operation, the roller 304 can move downwardly along the sloped rolling path 332 from the starting position to the ending position in the rolling track 306. As illustrated, the roller 304 is elevated relative to the bottom surface 180 at the starting position and may protrude out of the bottom surface 180 at the ending position. The degree of protrusion (DP), as measured by the distance between the bottom surface 180 and the lowest level of the roller 304 at the ending position, can be adjusted by tuning design parameters such as the size of the roller 304 and the slope angle of the grooves 322.

FIG. 11 is a flowchart diagram illustrating an example method 1100 for operating the suction head 120 having the rolling mechanism 190*b* in accordance with some embodiments. FIGS. 12A-12D are schematic diagrams illustrating cross-sectional views of the suction head 120 at various operational stages of the method 1100 in accordance with some embodiments. One of ordinary skill in the art would recognize many variations, modifications, and alternatives within the contemplation of the present disclosure. It should also be understood that FIGS. 12A-12D are not drawn to scale.

In the illustrated example of FIG. 11, the method 1100 includes operations 1102, 1104, 1106, and 1108. Also, it should be understood that the sequence of the various operations discussed above with reference to FIG. 11 is provided for illustrative purposes, and as such, other embodiments may utilize different sequences. These various sequences of operations are to be included within the scope of embodiments. It is also noted that the method 1100 is similar to the method 350 described above, and similar operations will not be repeated unless otherwise indicated.

Figures 12A, 12B, 12C, 12D:
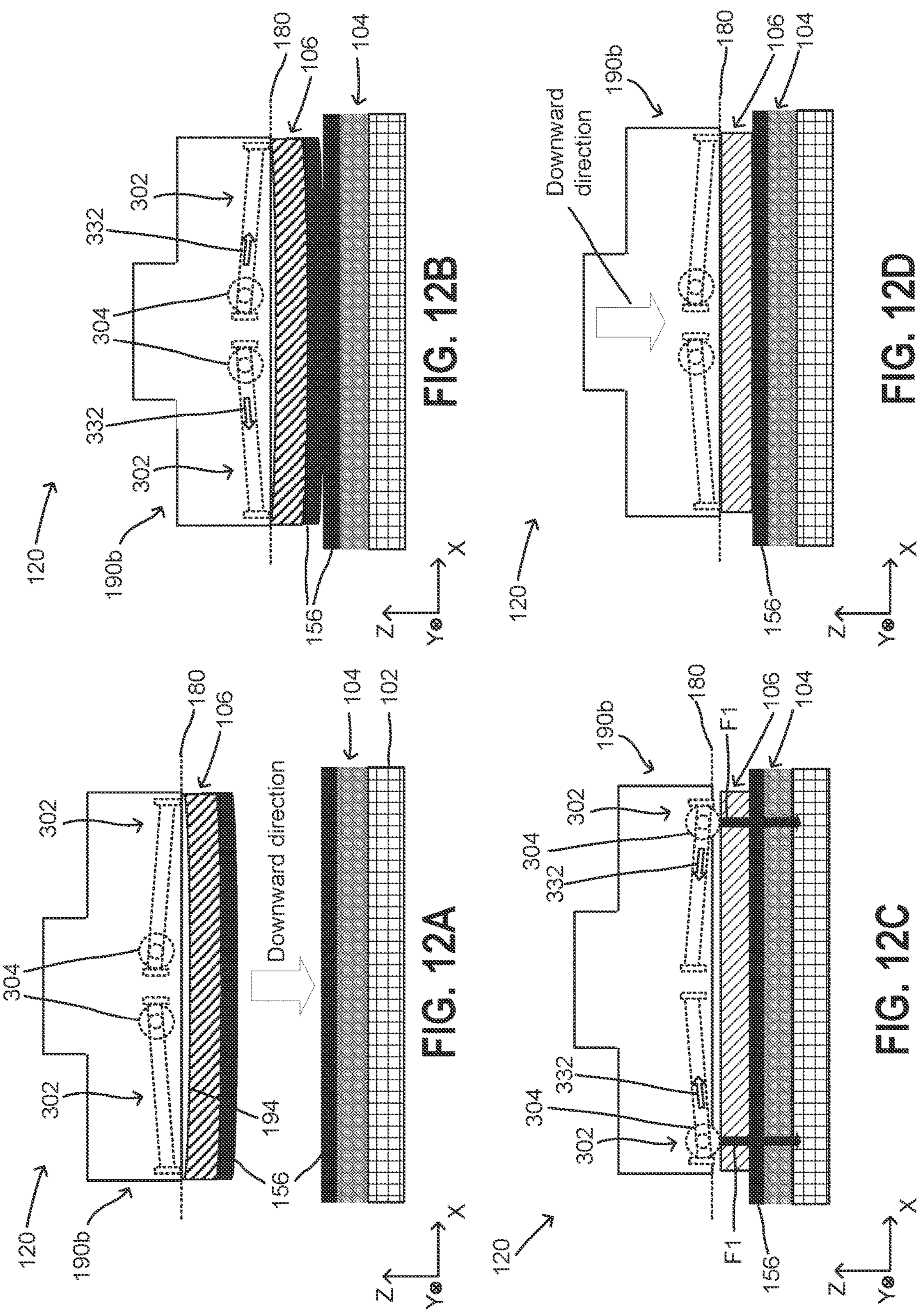
FIGS. 12A-12D are schematic diagrams illustrating various cross-sectional views of a suction head in accordance with some embodiments.

At operation 1102, a top die is picked and held by a suction head of a pick-and-place tool and is controlled to move downwardly toward a bottom die held by a wafer holder. A configuration of the suction head at operation 1102 is illustrated in FIG. 12A. As illustrated, the top die 106 held by the suction head 120 has a warpage with a gap between the bottom surface 194 of the top die 106 and the bottom surface 180 of the suction head 120. The rollers 304 of the rolling units 302 remain at the starting position, which is elevated above the bottom surface 180.

At operation 1104, the suction head is controlled and adjusted to cause the top die to engage with the bottom die. As illustrated in FIG. 12B, the bonding layer 156 of the top die 106 is contacted with the bonding layer 156 of the bottom die 104 in the central region 188 of the suction head 120.

At operation 1106, a rolling mechanism is actuated to cause a roller to move downwardly and press a corner portion of the top die. As illustrated in FIGS. 12B and 12C, the roller 304, driven by the motor 330, moves downwardly along the sloped rolling path 332 from the starting position (e.g., the higher end 326 of the rolling track 306) to the ending position (e.g., the lower end 328 of the rolling track 306). In some implementations, the roller 304 engages with the top die 106 in the middle of the path toward the ending position and continues to roll and press on the top die 106 thereafter. As mentioned above, the roller 304 can protrude out of the bottom surface 180 at the ending position and applies a downward force F1 to the corner portions of the top die. The roller 304 continues to press the corner portions of the top die 106 before retreating above the bottom surface 180. The downward force F1 can be adjusted to assure the complete correction of the warpage of the top die 106. As such, the top die 106 can be flattened and the bonding layers 156 of the top die 106 and the bottom die 104 are bonded to form a flat interface between the top die 106 and the bottom die 104.

At operation 1108, the suction head 120 is controlled to move downwardly and press the entire top die 106, as illustrated in FIG. 12D. In some implementations, the roller 304 is controlled to retreat to the starting position prior to the operation 1108.

Figure 13:
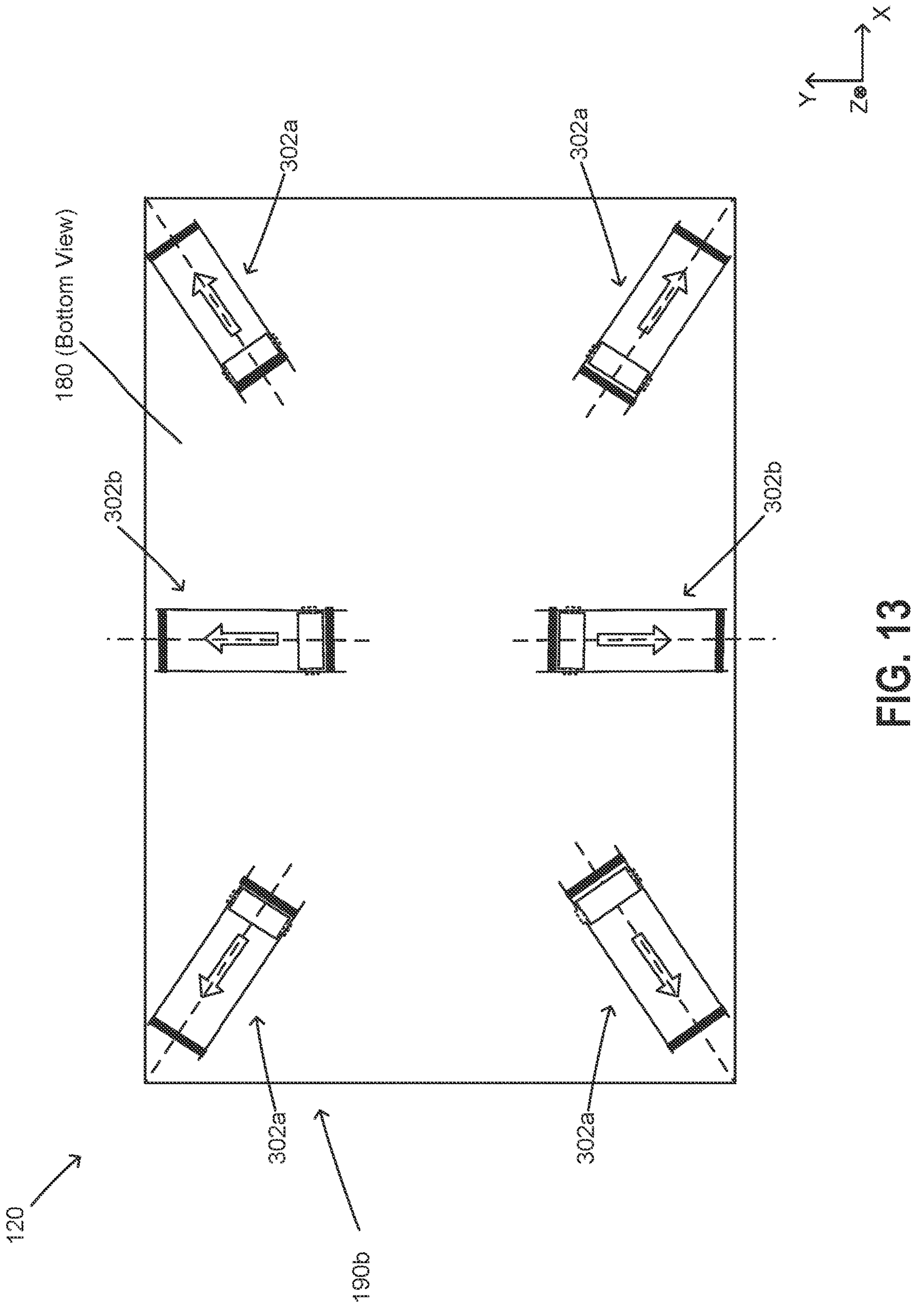
FIG. 13 is a schematic diagram illustrating a bottom view of an example suction head in accordance with some embodiments.

FIG. 13 is a schematic diagram illustrating a bottom view of another example of the suction head 120 having the rolling mechanism 190*b*. In the illustrated example, the rolling mechanism 190*b* includes multiple rolling units 302*a* and 302*b* (collectively as 302). The rolling units 302*a* each extend from the central region 188 to the corner regions 186, and the rolling units 302*b* each extend from the central regions 188 to the side region 184 along the Y-direction. In this arrangement, a larger area of the top die may be rolled and pressed by the rollers 304 of the rolling units 302*a* and 302*b*, as compared with the example shown in FIG. 10A. It is noted that the embodiments illustrated herein are not intended to be limiting, and the total number, pattern, and exact location of the rolling units 302 can vary, depending on design requirements.

Adjustable Downward Force Based on a Pressure Sensor

Figure 14A:
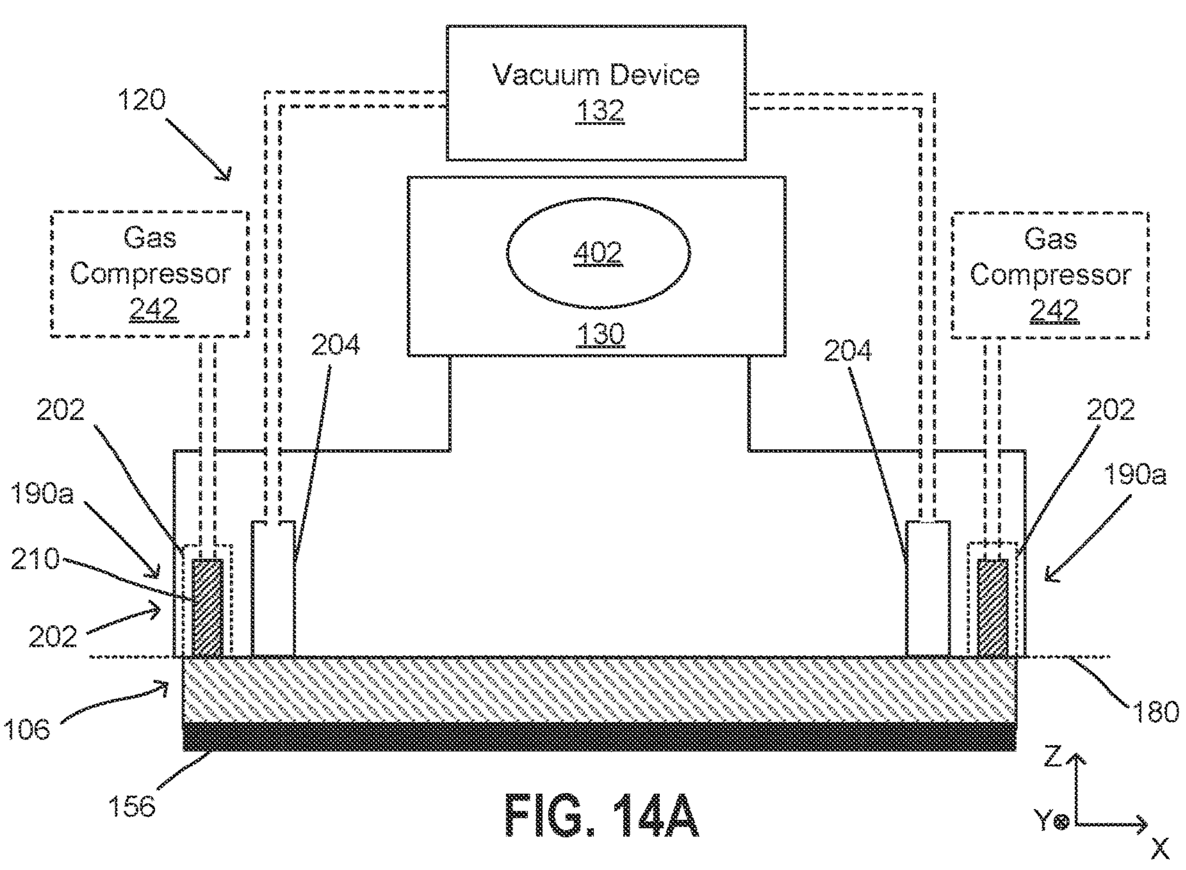
FIG. 14A is a schematic diagram illustrating a cross-sectional view of an example suction head in accordance with some embodiments.
Figure 14B:
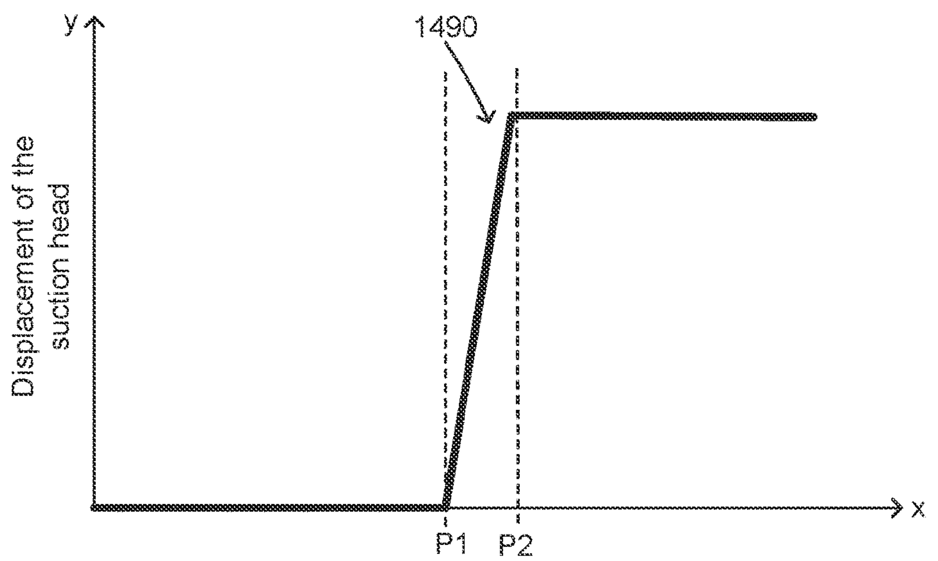
FIG. 14B is a graph illustrating a relationship between the displacement of the suction head relative to the bottom die and the pressure of the top die on the bottom die in accordance with some embodiments.

FIG. 14A is a schematic diagram illustrating another example of the suction head 120 in accordance with some embodiments. FIG. 14B is a graph illustrating a relationship between the displacement of the suction head relative to the bottom die in a die-to-die bonding process and the pressure of the top die on the bottom die in accordance with some embodiments. In the illustrated example of FIG. 14A, the suction head 120 is operably connected to a pressure sensor 402. In some embodiments, the pressure sensor 402 may be disposed in and operably connected to the suction shaft 130 shown in FIG. 1. The pressure sensor 402 is configured to detect and measure a pressure of the top die on the bottom die (hereinafter referred to as "the pressure").

It should be noted the pressure may be maintained in an optimal range to assure a sufficient bonding strength between the top die and the bottom die. But if the pressure is overly high (e.g., exceeding an upper limit), it may cause structural damages (e.g., crack, deformation, etc.) to the top die or the bottom die. As shown in FIG. 14B, in a linear region 1490 between a lower limit of pressure (P1) and an upper limit of pressure (P2), the displacement of the suction head relative to the bottom die can be determined based on the pressure of the top die on the bottom die measured by the pressor sensor. The downward force provided by the pushing mechanism 190*a* can be adjusted based on the displacement to maintain the pressure in an optimal range. Accordingly, the method for operating the suction head 120 may further include: measuring the pressure of the top die on the bottom die; determining the displacement of the suction head relative to the bottom die; and adjusting the downward force applied by the pushing mechanism based on the displacement.

It should be understood that the example of FIG. 14A is for illustrative purpose only and not intended to be limiting, and the pressure sensor 402 may also be used in combination with other warpage-correction mechanisms described herein, such as the pushing mechanism 190*a*, the rolling mechanism 190*b*, or an equivalent thereof.

Various Combinations

A person having ordinary skills in the art should understand that the present disclosure is not limited to the examples shown in the FIGS. 1-14B. Various combinations of the features disclosed herein may be combined, without limitation, in other embodiments. For example, a warpage-correction mechanism according to the present disclosure may include a combination of a pushing mechanism (e.g., 190*a* or 190*a*') and a rolling mechanism (e.g., 190*b*) as needed.

SUMMARY

In accordance with some aspects of the disclosure, a suction head of a pick-and-place tool for semiconductor device packaging is provided. The suction head includes: a suction unit configured to apply a suction force on a top die and pick and hold the top die; and a warpage-correction mechanism. The warpage-correction mechanism includes a pushing mechanism, and the pushing mechanism includes a plurality of pushing units, each of the plurality of pushing units disposed in a corner region of the suction head. Each of the plurality of pushing units includes: a tubular chamber extending vertically relative to a bottom surface of the suction head; and a pusher disposed in the tubular chamber and in air-tight contact with a side wall of the tubular chamber. The pusher is movable vertically and capable of protruding out of the bottom surface of the suction head to push a corner region of the top die and apply a downward force thereon.

In accordance with some aspects of the disclosure, a suction head of a pick-and-place tool for semiconductor device packaging is provided. The suction head includes: a suction unit configured to apply a suction force on a top die to pick and hold the top die; and a warpage-correction mechanism. The warpage-correction mechanism includes a rolling mechanism, and the rolling mechanism includes a plurality of rolling units. Each of the plurality of the rolling units includes a rolling track and a roller disposed therein. The rolling track extends from a higher end of the rolling track to a lower end of the rolling track, and the lower end is located in a corner region of the suction head. The roller is movable along a sloped rolling path between the higher end and the lower end of the rolling track. The roller is capable of protruding out of a bottom surface of the suction head to push a corner region of the top die and apply a downward force thereon.

In accordance with some aspects of the disclosure, a method is provided. The method includes: picking and holding a top die, using a suction head of a pick-and-place tool, and controlling the top die to move downwardly toward a bottom die; causing the top die to contact the bottom die; actuating a warpage-correction mechanism of the suction head to apply a downward force on a corner region of the top die; and pressing the suction head to bond the top die to the bottom die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A suction head of a pick-and-place tool for semiconductor device packaging, the suction head comprising:

a suction unit configured to apply a suction force on a top die and pick and hold the top die; and a warpage-correction mechanism, wherein the warpage-correction mechanism comprises a pushing mechanism, and the pushing mechanism comprises a plurality of pushing units, each of the plurality of pushing units disposed in a corner region of the suction head, wherein each of the plurality of pushing units comprises:

a tubular chamber extending vertically relative to a bottom surface of the suction head; and a pusher disposed in the tubular chamber and in air-tight contact with a side wall of the tubular chamber, wherein the pusher is movable vertically and capable of protruding out of the bottom surface of the suction head to push a corner region of the top die and apply a downward force thereon to press the top die against a bottom die, wherein the pusher is configured to be driven by a pressurized gas flow.

2. The suction head of claim 1, wherein the downward force applied on the top die is adjustable.

3. The suction head of claim 1, wherein the pushing mechanism further comprises a retracting mechanism configured to retract the pusher back into the tubular chamber.

4. The suction head of claim 3, wherein the retracting mechanism comprises at least one spring connecting a top wall of the tubular chamber and a top wall of the pusher.

5. The suction head of claim 1, wherein the pusher has a hollowed structure and encloses a suction chamber of the suction unit, such that the pusher and the suction chamber are concentric around a central axis in a vertical direction.

6. The suction head of claim 1, wherein the suction head is operably connected to a pressure sensor, the pressure sensor configured to measure a pressure of the top die applied on the bottom die, wherein the downward force is adjustable based on the pressure measured by the pressure sensor.

7. The suction head of claim 1, wherein the pressurized gas flow is provided by a pneumatic system operably connected to the plurality of pushing units.

8. The suction head of claim 1, wherein the pressurized gas flow is provided to the tubular chamber and pushes a top wall of the pusher.

9. The suction head of claim 2, wherein the downward force applied on the top die is adjusted by tuning a gas pressure of the pressurized gas flow.

10. The suction head of claim 2, wherein the downward force applied on the top die is adjusted by tuning a gas flow rate of the pressurized gas flow.

11. The suction head of claim 1, wherein the plurality of pushing units comprise four pushing units disposed in four corner regions of the suction head, respectively.

12. The suction head of claim 3, wherein the retracting mechanism is configured to retract the pusher back to a starting position of the pusher.

13. The suction head of claim 1, wherein the suction force is removed after placing the top die on a bottom die.

14. The suction head of claim 13, wherein the downward force is applied after the suction force is removed.

15. The suction head of claim 1, wherein the plurality of pushing units are farther away from a central region of the suction head than the suction unit.

* * * * *